(12) United States Patent
Kay et al.

(10) Patent No.: US 9,161,597 B2
(45) Date of Patent: Oct. 20, 2015

(54) PROTECTIVE CASE WITH INTERNAL SUSPENSION SYSTEM

(71) Applicant: OTTER PRODUCTS, LLC, Fort Collins, CO (US)

(72) Inventors: Martin J. Kay, San Carlos, CA (US); Bosung Kim, San Carlos, CA (US); Anthony P. Patron, Mountain View, CA (US); Virginia J. Wang, San Francisco, CA (US)

(73) Assignee: OTTER PRODUCTS, LLC, Fort Collins, CO (US)

( * ) Notice: Subject to any disclaimer, the term of this patent is extended or adjusted under 35 U.S.C. 154(b) by 0 days.

(21) Appl. No.: 14/485,639

(22) Filed: Sep. 12, 2014

(65) Prior Publication Data

US 2015/0068935 A1 Mar. 12, 2015

Related U.S. Application Data

(60) Provisional application No. 61/876,898, filed on Sep. 12, 2013.

(51) Int. Cl.
*A45C 11/00* (2006.01)
*A45C 13/36* (2006.01)

(52) U.S. Cl.
CPC ............... *A45C 11/00* (2013.01); *A45C 13/36* (2013.01); *A45C 2011/002* (2013.01); *A45C 2011/003* (2013.01)

(58) Field of Classification Search
CPC .................. A45C 2011/002; A45C 2011/003; A45C 2011/001; A45C 13/36; A45C 11/00; B65D 81/02; B65D 81/022; H04B 2001/3894; H04B 1/3888

USPC ........... 206/320; 361/679.3; 455/575.1, 575.8
See application file for complete search history.

(56) References Cited

U.S. PATENT DOCUMENTS

| | | | |
|---|---|---|---|
| 7,072,699 B2 | 7/2006 | Eiden | |
| 8,439,191 B1 * | 5/2013 | Lu | 206/320 |
| 8,531,834 B2 * | 9/2013 | Rayner | 361/679.56 |
| 8,640,868 B2 * | 2/2014 | O'Dowd et al. | 206/320 |
| 8,777,002 B2 * | 7/2014 | Lonsdale et al. | 206/320 |
| 8,922,985 B2 * | 12/2014 | Richardson | 361/679.3 |
| 2006/0172765 A1 | 8/2006 | Lev | |
| 2011/0073505 A1 * | 3/2011 | Stiehl | 206/320 |
| 2012/0037536 A1 | 2/2012 | Lonsdale, II et al. | |

(Continued)

FOREIGN PATENT DOCUMENTS

CN 202488509 U 10/2012

*Primary Examiner* — Steven A. Reynolds

(57) ABSTRACT

A protective case for a mobile electronic device can include a sliding back portion that permits quick and easy installation and removal of the mobile device. The protective case can include a chassis that resists bending or flexing during an impact event, thereby reducing stresses imparted to components of the mobile device housed in the protective case during the impact event. The protective case can include surface coverings to absorb and dissipate impact energy resulting from the impact event, thereby reducing impact forces transmitted to the mobile device. The protective case can include an internal suspension system configured to protect the electronic device from drop-induced damage and to preserve the resale value of an electronic device by minimizing cosmetic damage to external surfaces of the electronic device while housed in the case. In some examples, the protective case can be waterproof.

20 Claims, 17 Drawing Sheets

(56) References Cited

U.S. PATENT DOCUMENTS

| | | |
|---|---|---|
| 2012/0262618 A1* | 10/2012 | Weakly .................... 348/333.01 |
| 2012/0305422 A1* | 12/2012 | Vandiver ....................... 206/320 |
| 2013/0146491 A1* | 6/2013 | Ghali et al. .................... 206/320 |
| 2013/0341222 A1* | 12/2013 | Lin ............................... 206/320 |
| 2014/0034531 A1* | 2/2014 | Wang ............................ 206/320 |
| 2014/0036420 A1* | 2/2014 | Chen ........................ 361/679.01 |
| 2014/0076753 A1* | 3/2014 | Limber et al. ................. 206/320 |
| 2014/0138265 A1* | 5/2014 | Bong et al. ...................... 206/37 |
| 2014/0158559 A1* | 6/2014 | Yang et al. ...................... 206/37 |
| 2014/0183064 A1 | 7/2014 | Ge |
| 2014/0339104 A1* | 11/2014 | Magness ......................... 206/37 |
| 2014/0353178 A1* | 12/2014 | Kim ................................ 206/37 |
| 2015/0037618 A1* | 2/2015 | Kim .................................. 429/7 |
| 2015/0068934 A1* | 3/2015 | Armstrong ................... 206/320 |
| 2015/0076020 A1* | 3/2015 | Smith ........................... 206/320 |

\* cited by examiner

PROTECTIVE CASE WITH INTERNAL SUSPENSION SYSTEM

CROSS-CITE TO RELATED APPLICATION

This application claims the benefit of U.S. Provisional Patent Application No. 61/876,898 filed on Sep. 12, 2013, the content of which is hereby incorporated by reference in its entirety as if set out fully herein.

BACKGROUND

Mobile electronic devices, such as mobile phones, portable media players, personal computers, e-readers, tablet computers, and audio players, are becoming increasingly important in peoples' day-to-day activities. People rely on mobile electronic devices to communicate with others, engage in commerce, listen to music, watch videos, and manage personal calendars, just to name a few. Due to the high cost of mobile electronic devices, there is a strong incentive to protect these devices from physical damage, such as drop-induced damage. And due to resale value of electronic devices being determined largely by the cosmetic condition of the exterior surfaces of the electronic device, there is a strong economic incentive to protect electronic devices from cosmetic damages, such as scratches or marring.

Many existing protective cases impart wear marks or scratches on the electronic device over time. For instance, some slider cases may scratch a device during installation if debris, such as sand or pocket lint, is present at the interface between the device and an inner surface of the slider case. Other protective cases may result in marring due to subtle rubbing of the protective case against the electronic device over time. Marring can result in a glossy surface finish being reduced to a matte surface finish on certain portions of the electronic device, which is undesirable from a resale perspective. To avoid these outcomes, it can be desirable to have a protective case that effectively protects the electronic device against drop-induced damage but also does not impart visible signs of wear on exterior surfaces of the electronic device.

BRIEF DESCRIPTIONS OF DRAWINGS

DETAILED DESCRIPTION

Figure 1:
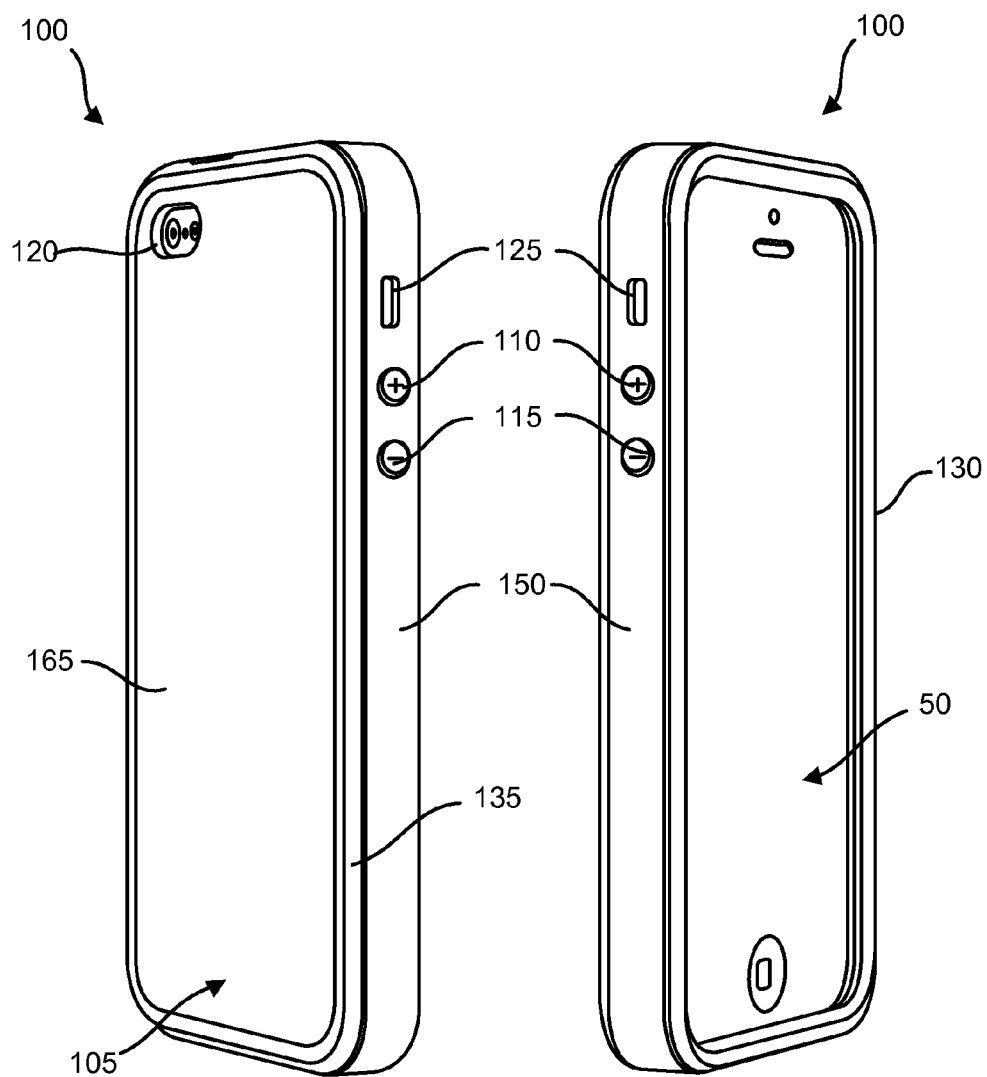
FIG. 1 shows a rear perspective view of a protective case for an electronic device to the left of a front perspective view of the same protective case.

Through experimental testing, researchers have discovered that significant stresses are placed on components of an electronic device when the device is dropped on its corner. Typically, when an electronic device is dropped on its corner, two or more sequential impacts result before the device comes to rest on the ground. This series of impacts is known as "clattering" and can lead to maximum stresses generated within components of the electronic device. These maximum stresses can result in failure of one or more components in the device. For instance, a maximum stress can result in a shattered screen, failure of a sensor (e.g. a proximity or light sensor), or failure or damage to an acoustic component (e.g. a microphone or speaker). To minimize stresses in components of the electronic device 50, it can be desirable to house the device in a protective case 100 that experiences minimal flexing or twisting during an impact event, and in turn transfers minimal flexing or twisting to the electronic device during the impact event.

To achieve this result, the protective case 100 can include a chassis 180 that resists bending or flexing during an impact event. The chassis 180 can lend stiffness to the protective case 100, thereby preventing the protective case from incurring damage during an impact event, and thereby protecting the electronic device 50 housed within the protective case from damage during that same impact event. The chassis may be designed with robust portions that enable the chassis to resist bending or flexing during impact, but may also be designed with thinner portions where added material would not substantively increase drop performance. For instance, the chassis 180 may be thinner along its side portions to reduce weight and thickness of the overall chassis, as well as to reduce material cost of the protective case. Conversely, the chassis 180 may be thicker at corner portions to provide additional protection against drop-induced damage to the electronic device resulting from repeated, randomly oriented drops onto a hard surface, such as a concrete floor. With these considerations in mind, the chassis 180 can have a variety of suitable thicknesses such as, for example, about 0.005-0.1, 0.01-0.08, 0.01-0.06, 0.01-0.05, or 0.01-0.04 in, depending on the location in the chassis.

Various examples of protective cases 100 for mobile electronic devices are shown in FIGS. 1-17. In certain examples, the protective case 100 can include a chassis, a sliding back portion 105, and an internal suspension system configured to protect the electronic device from drop-induced damage and to preserve the resale value of an electronic device by minimizing cosmetic damage to surfaces of the electronic device while housed in the case 100. In some examples, the protective case 100 can be waterproof and can include seals or gaskets (e.g. 131, 134) to allow the case to protect the electronic device from liquids.

The protective case 100 can be configured to house and protect a mobile electronic device 50, such as a smartphone, tablet, personal computer, or portable media player. The protective case 100 can have a sleek profile with exterior dimensions that are not significantly larger than the outer dimensions of the mobile electronic device 50 housed within the protective case. Despite having a sleek profile, the protective case 100 may provide a substantial level of protection to the electronic device due to an innovative internal suspension system that elevates the device relative to inner surfaces of the protective case at a distance engineered to avoid rubbing-induced damage. In some examples, the protective case 100 can have an external feel or appearance that mimics the feel or appearance of the electronic device housed within the protective case.

The protective case 100, covering, housing, container, or encasement can be made of any suitable material or combination of materials. In one example, the protective case 100 can include a chassis 180, which is shown in the cross-sectional view of FIG. 7. The chassis 180 can be made of any suitable material, such as cast, forged, or machined metal, including, for example, aluminum, titanium, or steel. In other examples, wood, polymer, carbon fiber composite, alkali-aluminosilicate sheet toughened glass, or sapphire glass can make up all or a portion of the chassis 180.

The chassis 180 can include a plurality of outer surfaces, including an outer left side surface, an outer right side surface, an outer bottom side surface, and an outer top side surface. The outer surfaces of the chassis 180 can be covered with a softer material, and the softer material can define a surface covering that improves the feel of the protective case. The surface covering can also provide an increased coefficient of friction compared to the bare chassis surface, which can be useful for preventing the protective case from sliding off of an inclined surface, such as an automobile dash, where the electronic device may be positioned for visual display and audible transmission of navigational route instructions to a driver of the automobile.

The surface covering can be made of any suitable material, such as leather, rubber, textile, composite, polymer, or combination thereof. The surface covering can absorb and dissipate impact energy during an impact event, thereby protecting the electronic device 50 from drop or bump-induced damage.

The combination of the chassis 180 and surface covering can protect the electronic device 50 from a wide variety of damage that either the chassis 180 or surface covering alone could not protect against. The chassis 180 can allow the protective case 100 to resist bending or flexing during an impact event, thereby reducing stresses imparted to components of the electronic device, and the surface covering can absorb and dissipate impact energy during the same impact event, thereby reducing impact forces transmitted to the electronic device.

Figure 7:
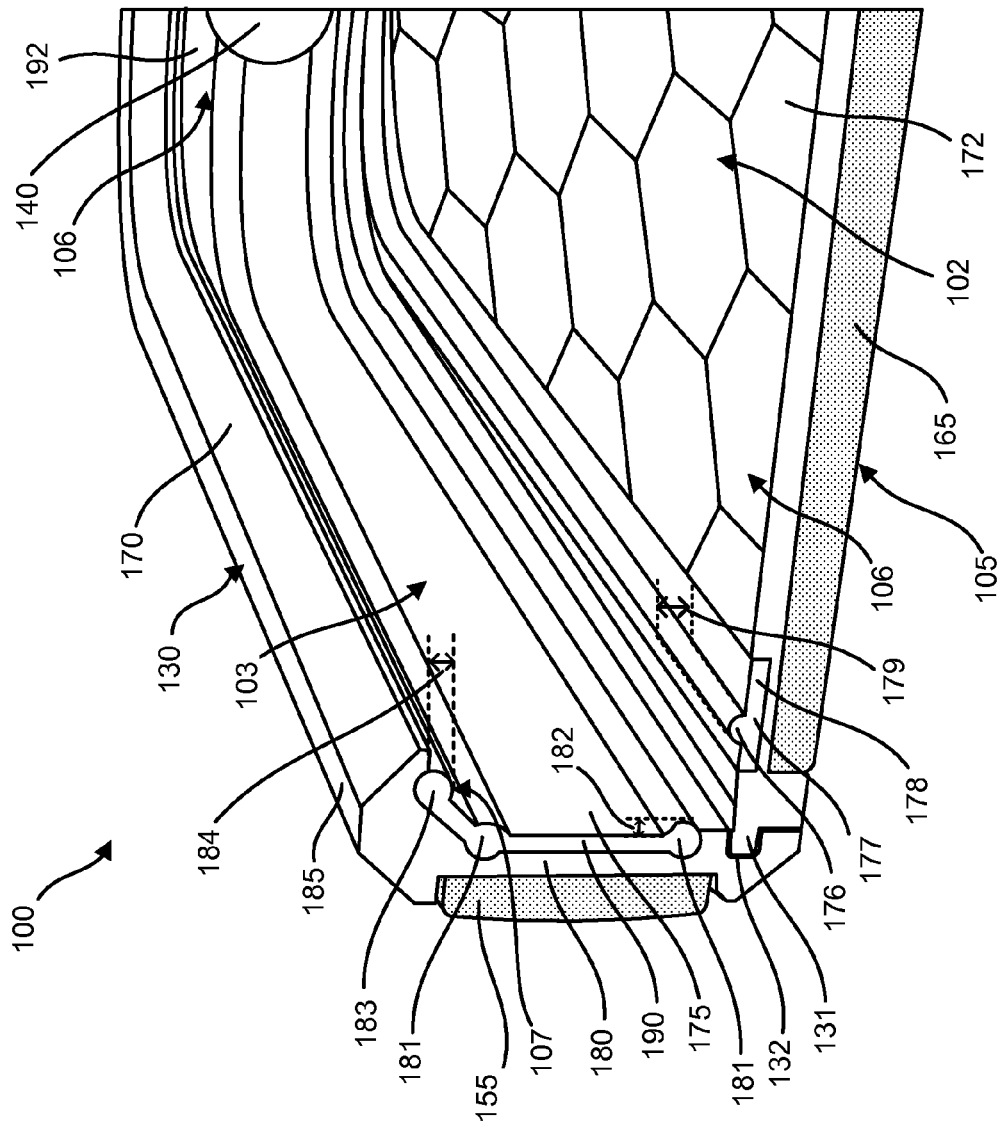
FIG. 7 shows a partial cross-sectional view of the protective case of FIG. 6 taken along section A-A, where the protective case includes an internal suspension system.

In some examples, the surface covering can include a plurality of surface coverings, such as a back surface covering 165, a left side surface covering 150, a right side surface covering 155, and a top side surface covering 160. The back surface covering 165 can be affixed to an outer surface of the sliding back portion 105. The left side surface covering 150 can be affixed to an outer left side surface of the chassis. The right side surface covering 155 can be affixed to an outer right side surface of the chassis. As shown in FIG. 7, the surface covering portions (e.g. 155, 165) can extend outward beyond the outer perimeter of the chassis 180, which can allow the surface covering portions to behave as resilient crumple zones during an impact event, effectively compressing and absorbing impact energy before an outer surface of the chassis 180 contacts the ground.

In some examples, the surface covering can be made of leather. In addition to being durable and reconditionable and having a desirable, warm feel, the leather surface coverings can have many other advantages. For instance, the leather surface covering can absorb and dissipate impact energy, thereby protecting the electronic device 50 from drop or bump-induced damage. Also, the leather surface coverings can provide a static coefficient of friction that is suitable to prevent the protective case 100 from sliding when placed on a relatively smooth, sloped surface, such as a dashboard of an automobile, thereby avoiding damage that could result from unwanted movement. For instance, the static coefficient of friction between the leather surface covering and the automobile dashboard can be about 0.2-0.65, 0.25-0.5, 0.25-0.35, or 0.4-0.6.

The surface coving can permit a user to access or interact with features on the electronic device 50 without needing to remove the electronic device from the protective case 100. For example, as shown in FIG. 1, volume buttons (110, 115) located on a side surface of the electronic device 50 can be actuated through a left side surface covering 150 of the protective case 100. In this example, the chassis can include openings proximate the volume buttons (110, 115) to permit interaction of the buttons by applying force to the outer surface of the surface covering proximate the volume buttons.

The left side surface covering 150 can be slightly raised proximate the volume buttons (110, 115) to permit a user to identify the button locations by touch alone. This attribute can be desirable if the user desires to adjust the volume setting on the electronic device when the device is not visible to the user (e.g. when the device is in the user's pocket or purse and the user wants to adjust a ringtone volume without removing the device from its stowed location). Alternately, the protective case 100 can include an opening to permit access to features on the electronic device 50, such as an opening for a mute rocker switch 125, as shown in FIG. 4, or an opening 140 to accommodate a connector port 145, speaker 146, or microphone 147.

In certain examples, there may not be a distinct break between various portions of the surface covering (e.g. 150, 155, 160, 165). For instance, as shown in FIG. 4, there may not be a visible break between the left side surface covering 150 and the top side surface covering 160. Instead, the left side surface covering 150 and the top side surface 160 may form a continuous surface covering that wraps around a top left corner of the protective case 100. Similarly, there may not be a visible break between the right side surface covering 155 and the top side surface covering 160. Instead, the right side surface covering 155 and the top side surface 160 may form a continuous surface covering that wraps around a top right corner of the protective case 100

Figure 4:
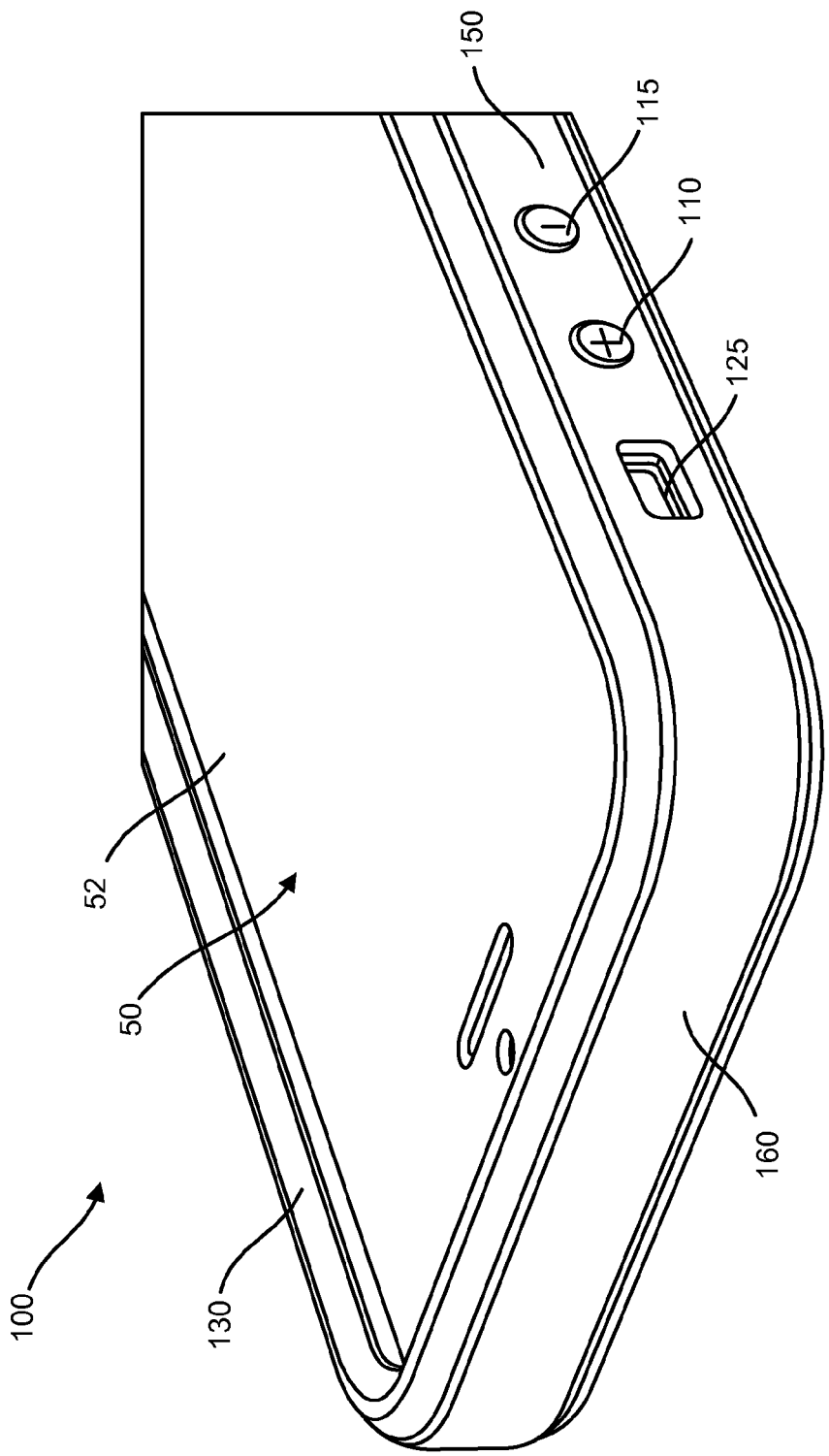
FIG. 4 shows a partial front perspective view of a protective case with a sliding back portion and an electronic device housed within the protective case.
Figure 5:
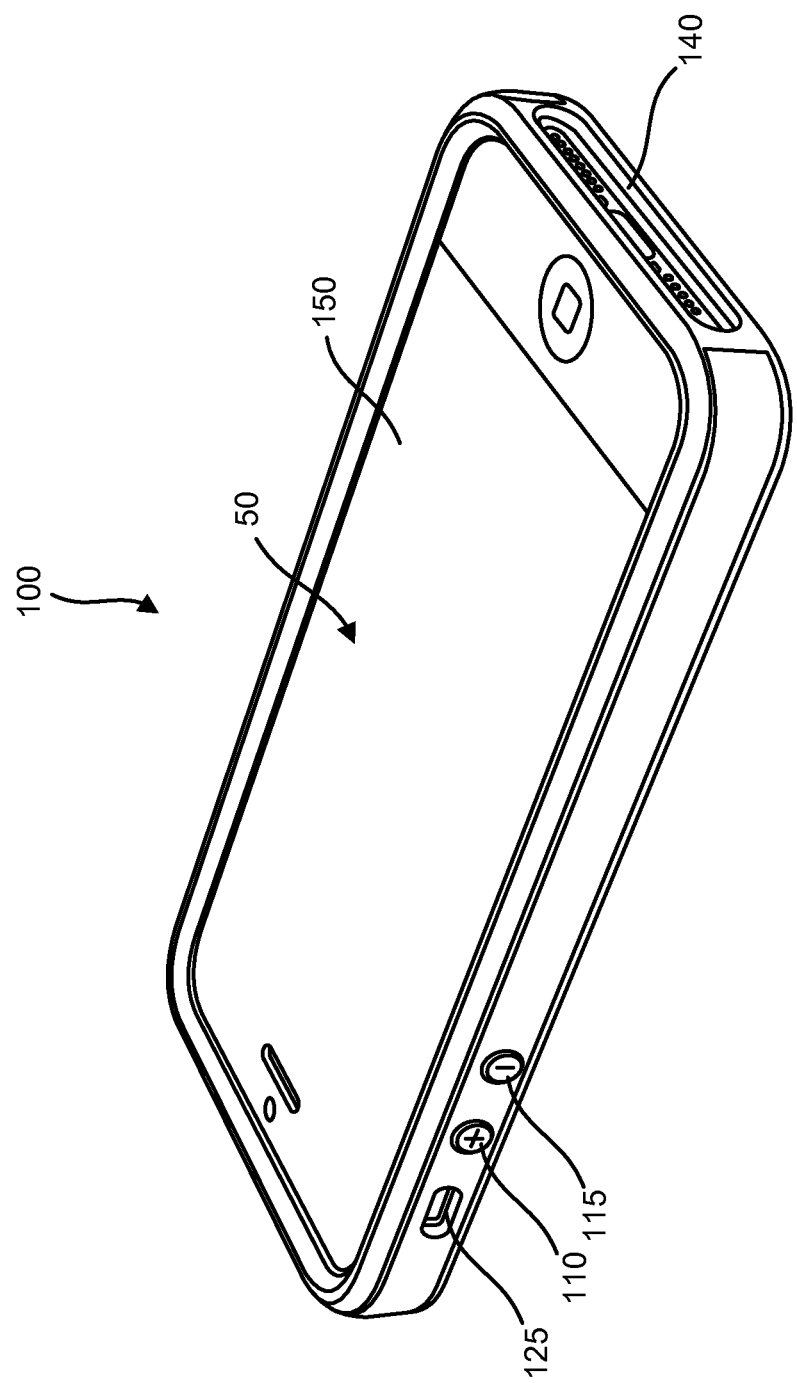
FIG. 5 shows a front perspective view of a protective case with a sliding back portion and an electronic device housed within the protective case.

The protective case 100 can include a front bezel 130, as shown in FIG. 4, that extends around a front surface of the protective case and a rear bezel 135 that extends around a rear surface of the protective case. The front bezel 130 can have a beveled surface 170, as shown in FIG. 7, that slopes gradually toward a touchscreen surface of an electronic device 50 when the device is installed in the case. This geometry can be more comfortable for a user when making a swiping gesture on the touchscreen surface, since the user's finger can glide up and over the front bezel 130 rather than catching abruptly on a sharp edge if the beveled surface 170 were not present. The front bezel 130 can include a raised flat portion 185 that is configured to contact, for example, a surface of a table to prevent the touchscreen of the electronic device from directly contacting the surface of the table when the device is placed in a facedown orientation. The front and rear bezels (130, 135) can be made of any suitable material, including metal, polymer, alkali-aluminosilicate sheet toughened glass, natural fiber, composite, or combination thereof. In some examples, the front and rear bezels can be made of anodized aluminum or nickel plated steel.

Figure 6:
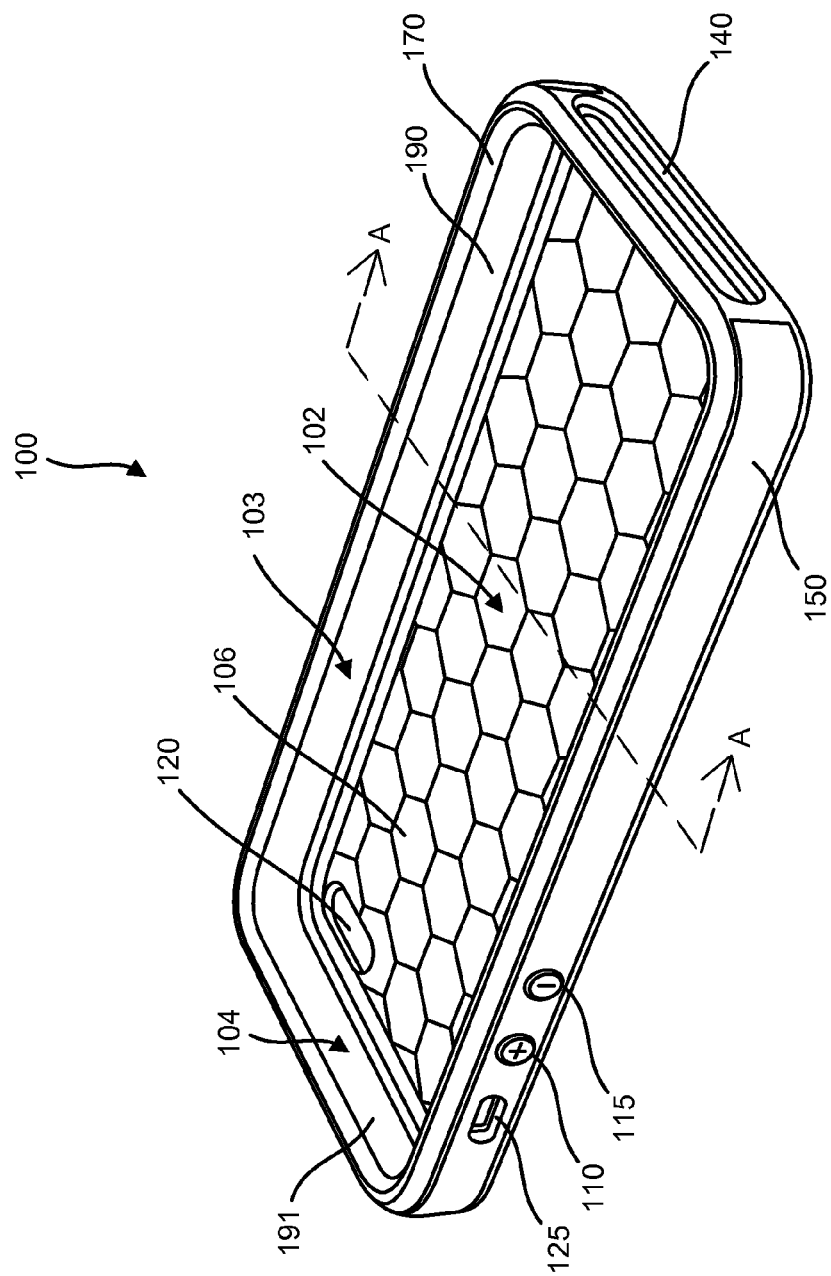
FIG. 6 shows a front perspective view of a protective case with a sliding back portion fully installed on the protective case and no electronic device housed within the protective case.

The protective case 100 can include a cavity 102 in the chassis, and the cavity can be configured to receive and retain the electronic device 50. The cavity 102 can include an inner left side surface, inner right side surface 103, inner bottom side surface 106, inner front side surface 107, and an inner top side surface 104, as shown in FIGS. 6 and 7. A cushion layer 175 can be disposed on one or more surfaces defining the cavity 102, as shown in FIG. 6 and the cross-sectional view of FIG. 7. The cushion layer 175 can protect the electronic device 50 from impact-induced damage, for example, by dissipating impact energy resulting from a drop. The cushion layer 175 can also serve to isolate the electronic device 50 from the chassis 180, thereby protecting exterior surfaces of the electronic device from being scratched by the chassis. The cushion layer can have a thickness of about 0.005 to 0.25, 0.005 to 0.1, 0.01 to 0.08, 0.01 to 0.06, 0.01 to 0.05, or 0.01 to 0.04 in.

Many companies have trade-in or buyback programs focused on purchasing and reselling used mobile electronic devices. Examples of companies with trade-in or buyback programs include GAZELLE, BESTBUY, BUYMYTRONICS, GLYDE, NEXTWORTH, RADIOSHACK, and TOTEM. When determining the value of a used electronic device, the company will commonly factor in the device's physical appearance. A device that has no visible signs of wear typically fetches a higher resale value than a device that has visible signs of wear. Therefore, to ensure maximum resale of an electronic device, it is desirable to prevent the device from being scratched during a period of ownership. Simply enclosing the electronic device in a protective case may not adequately safeguard the electronic device from being scratched. Many protective cases impart wear marks or scratches on the electronic device over time. For instance, some slider cases may scratch a device during installation if debris (e.g. sand or pocket lint) is trapped between the device and an inner surface of the slider case. Other protective cases may result in marring due to subtle rubbing of the protective case against the electronic device over time if the case does not have a precision fit. Marring can result in a glossy surface finish being reduced to a matte surface finish on surfaces of the electronic device, which is undesirable from a resale perspective. To avoid these outcomes, it can be desirable to have a protective case that effectively protects the electronic device 50 against drop-induced damage and also avoids imparting visible signs of wear on exterior surfaces of the electronic device. To accomplish this objective, the protective case can provide air gaps, as described herein, that establish clearance volumes between the electronic device and inner surfaces of the protective case, thereby preventing formation of visible signs of wear on the electronic device.

The cushion layer can be made of any suitable material such as a saturated or unsaturated elastomer. Examples of suitable materials include silicon rubbers and thermoplastic elastomers, including silicone-based thermoplastics. These examples of suitable materials are not intended to be limiting. To ensure proper performance, the cushion layer can have a hardness of, for example, 30-70, 30-50, or 40-50 Shore A.

To form the cushion layer, a thermoplastic elastomer can be injection molded into the cavity 102 of the chassis 180. The thermoplastic elastomer can have a melting point of about 410-450, 420-440, or 430° F. During manufacturing, a mold can be used to form the cushion layer. The mold can be installed within an injection molding machine. To ensure consistent injection molding performance, the mold can be maintained at a temperature of about 100° F. To form the cushion layer 175, the thermoplastic elastomer can be injected into the cavity 102 in the protective case 100 at a suitable temperature and pressure to ensure proper flow of the thermoplastic elastomer. After the cushion layer has been formed and the injection molding process is complete, the mold can then be opened, and the protective enclosure 100 can be removed from the mold.

As an alternative to the overmolding process described above, the cushion layer 175 can be injection molded as a separate component and affixed to one or more surfaces of the cavity 102 during a secondary assembly process. During the secondary assembly process, the injection molded cushion layer can be affixed to the chassis by, for example, an adhesive layer. Due to the additional steps required to produce an injection molded cushion layer 175, using an overmolded cushion layer can be more desirable. In addition, due to bonding that occurs on a molecular level, an overmolded cushion layer may be less likely to separate from the chassis 180 than an injection molded cushion layer that is separately formed and later affixed to chassis by an adhesive.

The cushion layer 175 can include one or more cushion layer portions. In some examples, the cushion layer portions can be interconnected to form a continuous cushion layer over one or more surfaces of the cavity in the chassis 180. Alternately, the cushion layer portions can be discrete cushion layer portions that are not interconnected. In yet another example, some of the cushion layer portions may be interconnected and some may not be interconnected, as shown in FIG. 7. A portion of the cushion layer 175 can cover a portion of an inner left side surface of the cavity 102. The inner right side surface 103 of the cavity 102 can be covered by a right side cushion layer 190, as shown in FIG. 7. The inner bottom side surface 106 of the cavity 102 can be covered by a bottom side cushion layer 192. The inner top side surface 104 of the cavity 102 can be covered by a top side cushion layer 192.

Figure 2:
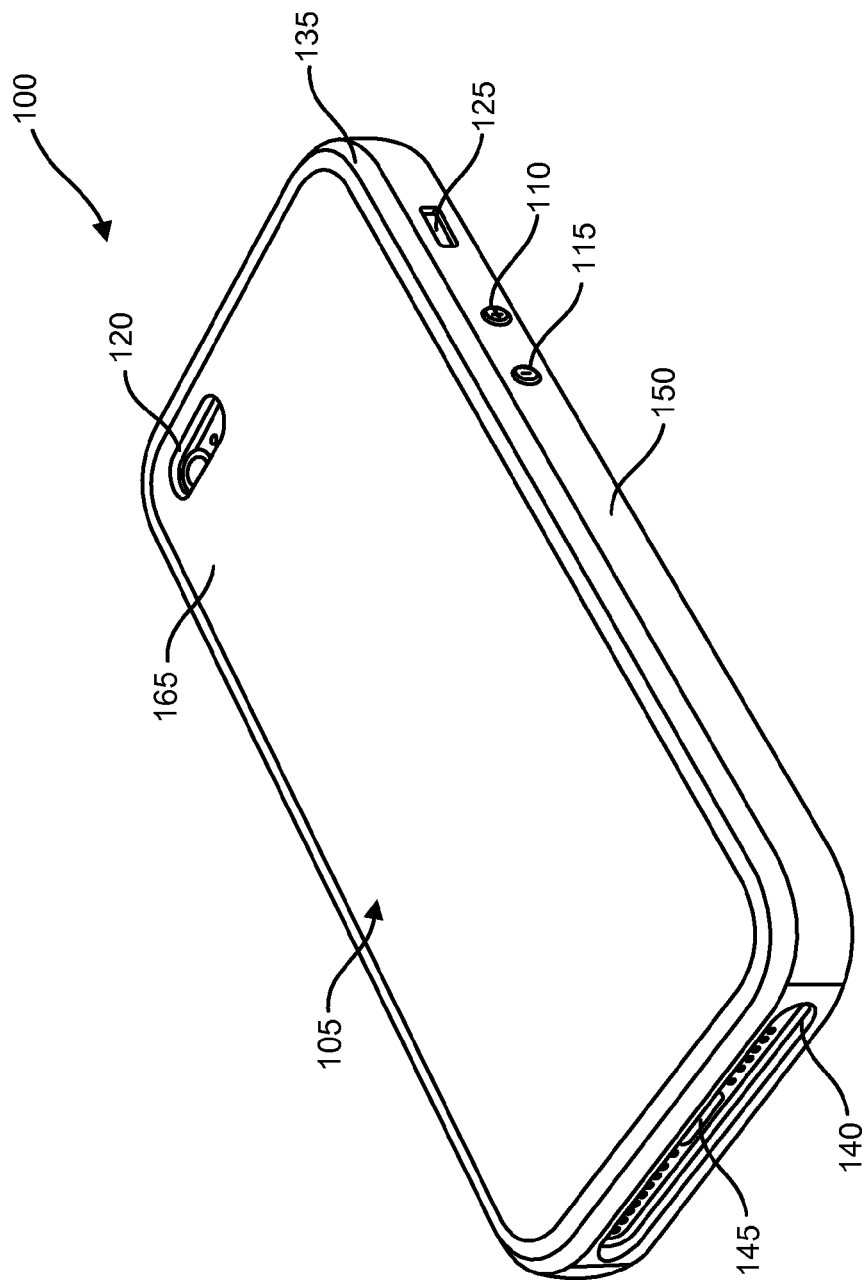
FIG. 2 shows a rear perspective view of a protective case with an electronic device housed within the protective case and a sliding back portion fully installed on the protective case.
Figure 3:
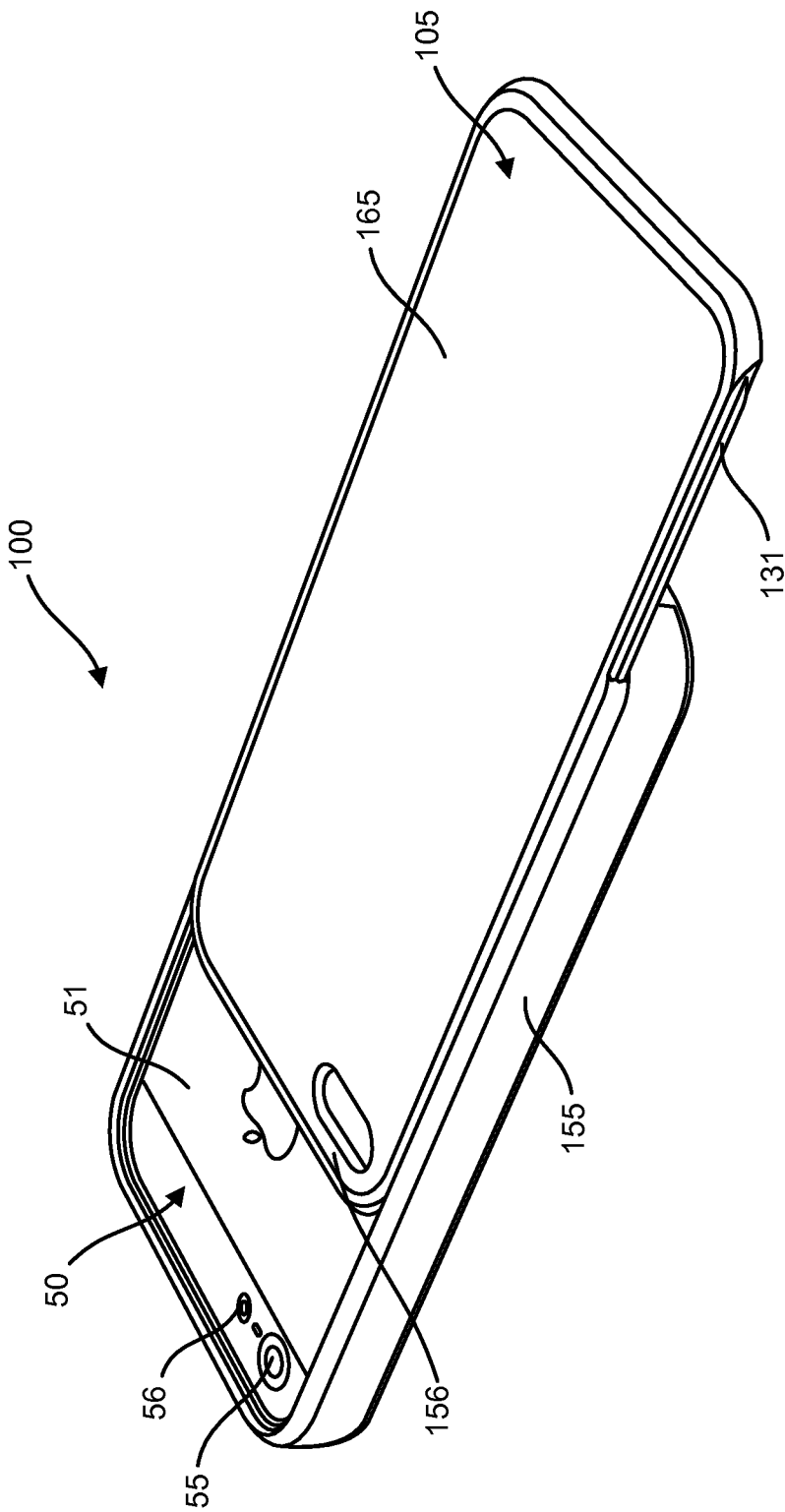
FIG. 3 shows a rear perspective view of a protective case with an electronic device housed within the protective case and a sliding back portion partially installed on the protective case.

As shown in FIG. 7, the sliding back portion 105 can be configured to slidably attach to the chassis 180. FIG. 3 shows the sliding back portion 105 partially installed on the protective case 100, and FIG. 2 shows the sliding back portion fully installed on the protective case. The sliding back portion 105 can include an inner surface and an outer surface. A cushion layer can be overmolded on a portion of the inner surface of the sliding back portion 105, as shown in FIG. 7. The cushion layer 177 can be disposed in a channel 178 formed on the inner surface of the sliding back portion 105. Sides of the channel 178 can provide additional surface area for the cushion layer 177 to adhere to, and that additional bonding area can help to ensure the cushion layer 177 does not separate from the sliding back portion over time.

Figure 13:
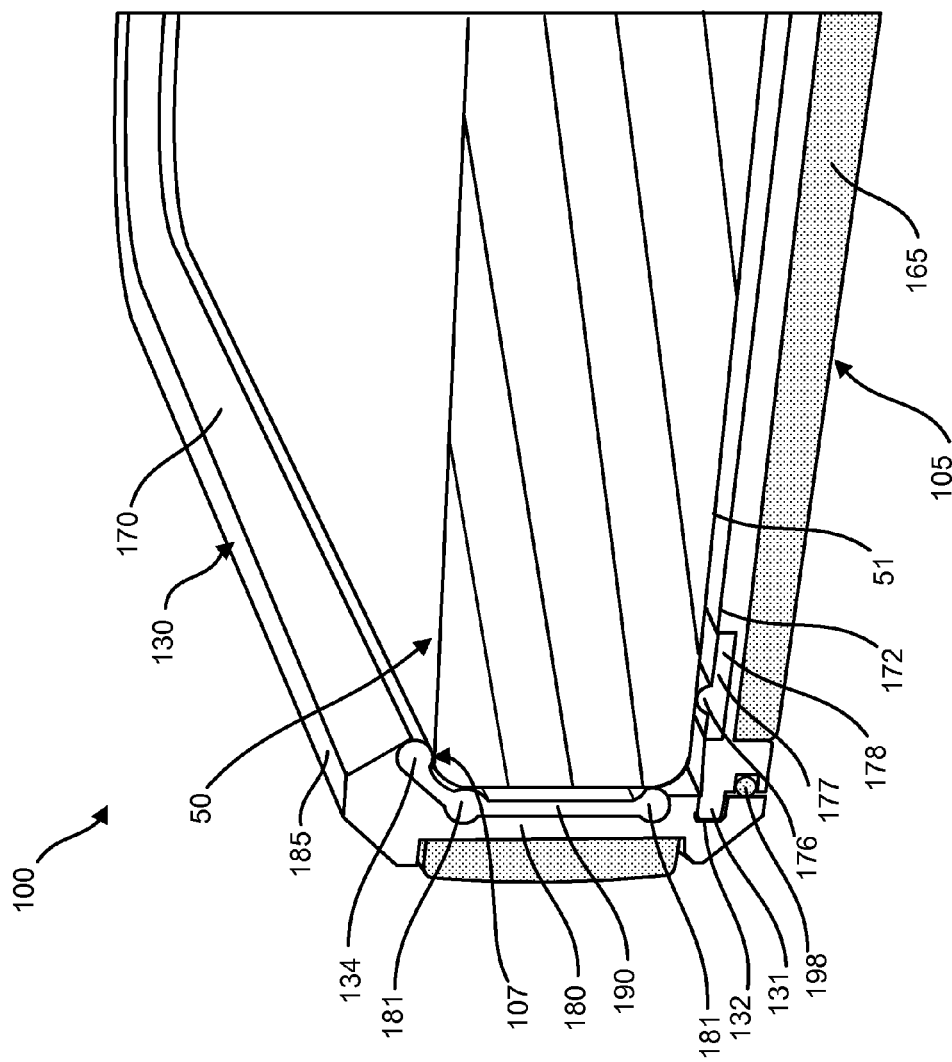
FIG. 13 shows a partial cross-sectional view of a waterproof protective case configured to form a watertight seal against a surface of an electronic device.

As shown in FIG. 13, the cushion layer 177 can include a back side suspension portion 176 configured to provide separation between a back surface of the electronic device and an inner surface 172 of the sliding back portion 105. The back side suspension portion 176 can prevent scratching of the back surface 51 of the electronic device 50 when sliding the sliding back portion 105 is installed into the chassis 180. The back side suspension portion 176 on the sliding back portion 105 can extend the entire length of the electronic device 50 or less than the entire length of the electronic device. The back side suspension portion 176 can be one continuous raised portion or can be made up of two or more raised portions along all or part of a length or width of the back surface 51 of the electronic device 50. In certain examples, the back side suspension portion 176 can have a length of about 0.125-2.0, 0.125-8.0, 0.5-6.0, 2.0-6.0, 4.0-6.0, or 5.0-6.0 inches. The back side raised portion 176 can have any suitable shape, such as a partial cylinder as shown in FIG. 7, partial prism, or partial cuboid.

The back side suspension portion 176 on the sliding back portion 105 can be configured to provide a back air gap 179, as shown in FIG. 7, between the inner surface 172 of the sliding back portion 105 and a back surface 51 of the electronic device 50. The back air gap 179 can prevent abrasion of the back surface 51 of the electronic device 50 during installation of the sliding back portion 105, as shown in FIG. 3, by preventing the inner surface 172 of the sliding back portion 105 from directly contacting or rubbing against the back surface 51 of the electronic device 50 as the sliding back portion slides into the fully installed position. The back air gap 179 can have any suitable dimension such as, for example, about 0.005-0.1, 0.005-0.08, 0.01-0.05, 0.02-0.04, 0.01-0.020, or 0.01-0.03 in, where the back air gap is measured between an inner surface 172 of the sliding back portion 105 and a back surface 51 of the electronic device 50 when the electronic device is installed in the protective case and the sliding back portion is fully installed.

The cushion layer 175 can include a right side suspension portion 181 extending from a cushion layer 175 located on an inner side surface of the cavity 102, as shown in FIG. 7. The right side suspension portion 181 can be configured to provide separation between a side surface of the electronic device 50 and an inner side surface of the cavity 102. The right side suspension portion 181 can prevent scratching of a side surface of the electronic device when installed in the protective case 100. The right side suspension portion 181 can be configured to provide a right side air gap 182, as shown in FIG. 7, between the right side surface of the electronic device 50 and the right side cushion cover 190. The right side air gap 182 can have any suitable dimension such as, for example, about 0.005-0.1, 0.005-0.08, 0.01-0.05, 0.02-0.04, 0.01-0.02, or 0.01-0.03 in, where the side air gap is measured between a surface of the right side cushion cover 190 and a right side surface of the electronic device 50 when the electronic device is installed in the protective case and the sliding back portion 105 is installed.

The right side suspension portion 181 on the on right side cushion layer 190 can extend the entire length of the electronic device 50 or less than the entire length of the electronic device. The right side suspension portion 181 can be one continuous raised portion or can be made up of two or more raised portions along the length of the electronic device. In certain examples, the right side suspension portion 181 can have a length of about 0.125-8.0, 0.5-6.0, 2.0-6.0, 4.0-6.0, or 5.0-6.0 inches. The right side suspension portion 181 can have any suitable shape, such as a partial cylinder as shown in FIG. 7, partial prism, or partial cuboid.

The protective case can include a left side suspension portion extending from a cushion layer on the inner right side surface of the cavity 102. The left side suspension portion can be configured to provide a left side air gap between the cushion layer and a left side of the electronic device when the electronic device is installed in the protective case. The left side suspension portion can extend the entire length of the electronic device 50 or less than the entire length of the electronic device. The left side suspension portion can be one continuous raised portion or can be made up of two or more suspension portions along the length of the electronic device. In certain examples, the left side suspension portion can have a length of about 0.125-8.0, 0.5-6.0, 2.0-6.0, 4.0-6.0, or 5.0-6.0 inches. The left side suspension portion 181 can have any suitable shape, such as a partial cylinder as shown in FIG. 7, partial prism, or partial cuboid.

The cushion layer 175 can include a front side suspension portion 183 extending from a cushion layer 175 located on an inner front side surface 107 of the cavity 102, as shown in FIG. 7. The front side suspension portion 183 can be configured to provide separation between a front side surface 52 of the electronic device 50 and an inner front side surface 107 of the cavity 102. The front side suspension portion 183 can prevent scratching of a front surface 52 of the electronic device 50 when installed in the protective case 100. The front side suspension portion 183 can be configured to provide a front air gap 184, as shown in FIG. 7, between the front surface 52 of the electronic device 50 and the front bezel 130 of the chassis 180. The front air gap 184 can have any suitable dimension such as, for example, about 0.005-0.1, 0.005-0.08, 0.01-0.05, 0.02-0.04, 0.01-0.02, or 0.01-0.03 in, where the front air gap is measured between an inner surface of the front bezel 130 and the front surface 52 of the electronic device 50 when the electronic device is installed in the protective case and the sliding back portion 105 is installed.

The front side suspension portion 183 on the front side cushion layer can extend the entire length of the electronic device 50 or less than the entire length of the electronic device. The front side suspension portion 183 can be one continuous raised portion or can be made up of two or more raised portions along the length of the electronic device 50. In certain examples, the front side suspension portion 183 can have a length of about 0.125-8.0, 0.5-6.0, 2.0-6.0, 4.0-6.0, or 5.0-6.0 inches. The front side suspension portion 183 can have any suitable shape, such as a partial cylinder as shown in FIG. 7, partial prism, or partial cuboid.

The sliding back portion 105 can slidably attach to the chassis 180 by any suitable method of attachment. In one example, the sliding back portion 105 can have rails 131 extending along a right side edge and a left side edge, and each rail can be configured to mate with a corresponding rail receiver 132 in the chassis, as shown in FIG. 7. In another example, the sliding back portion 105 can have rail receivers 132 extending from a right side edge and a left side edge, and each rail receiver can be configured to mate with a corresponding rail in the chassis 180.

As shown in FIG. 3, during installation, the sliding back portion 105 can be configured to initially engage the chassis 180 near a bottom side surface of the chassis. This configuration can be desirable, since it can minimize abrasion to a camera lens 55 and camera flash 56 located on a back surface of the electronic device 50 during installation of the sliding back portion 105. As shown in FIGS. 1-3, the protective case 100 can include a camera opening 120 in the sliding back portion 105. An upper portion 156 of the sliding back portion 105, which can be located between the camera opening 120 and a top side of the sliding back portion as shown in FIG. 3, can be designed to provide a camera air gap between an inner surface 172 of the sliding back portion 105 and a back surface 51 of the electronic device 50. The camera air gap can prevent abrasion to the camera lens 55 and camera flash 56 during installation of the sliding back portion 105, as shown in FIG. 3. The camera air gap can have any suitable dimension such as, for example, about 0.005-0.1, 0.005-0.08, 0.01-0.05, 0.01-0.02, or 0.01-0.03 in, where the camera air gap is measured between an inner surface 172 of the sliding back portion 105 and a back surface 51 of the electronic device 50.

Figure 14B:
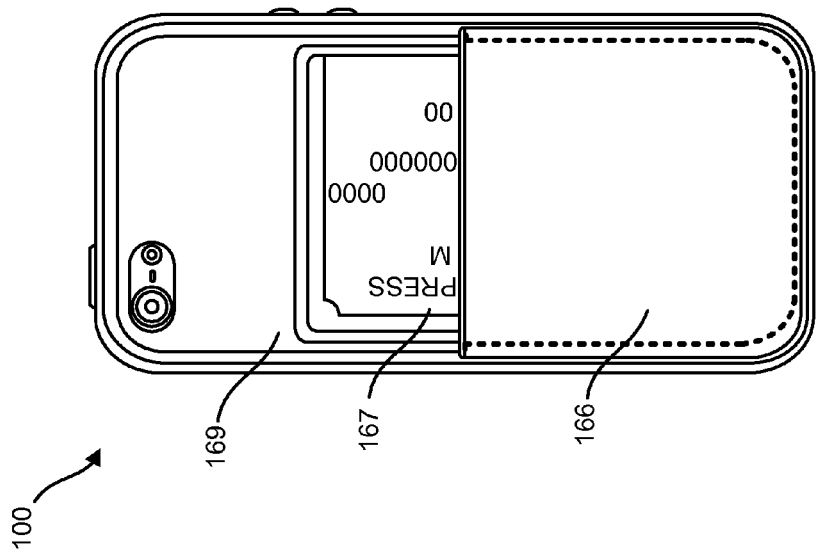
FIG. 14B shows a protective case with a pocket configured to receive and store a card, where the pocket includes an access opening to facilitate removal of the card from the pocket.
Figure 14A:
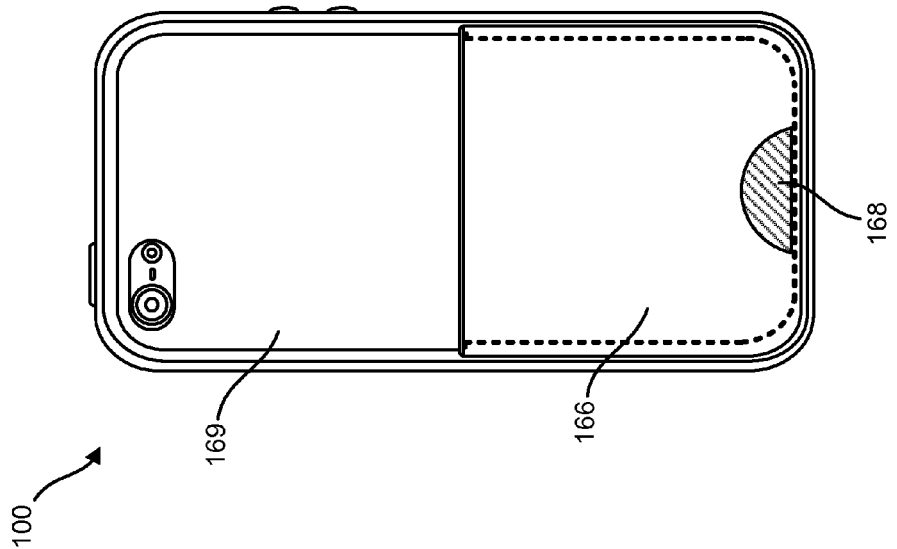
FIG. 14A shows a protective case with a pocket configured to receive and store a card.
Figure 15:
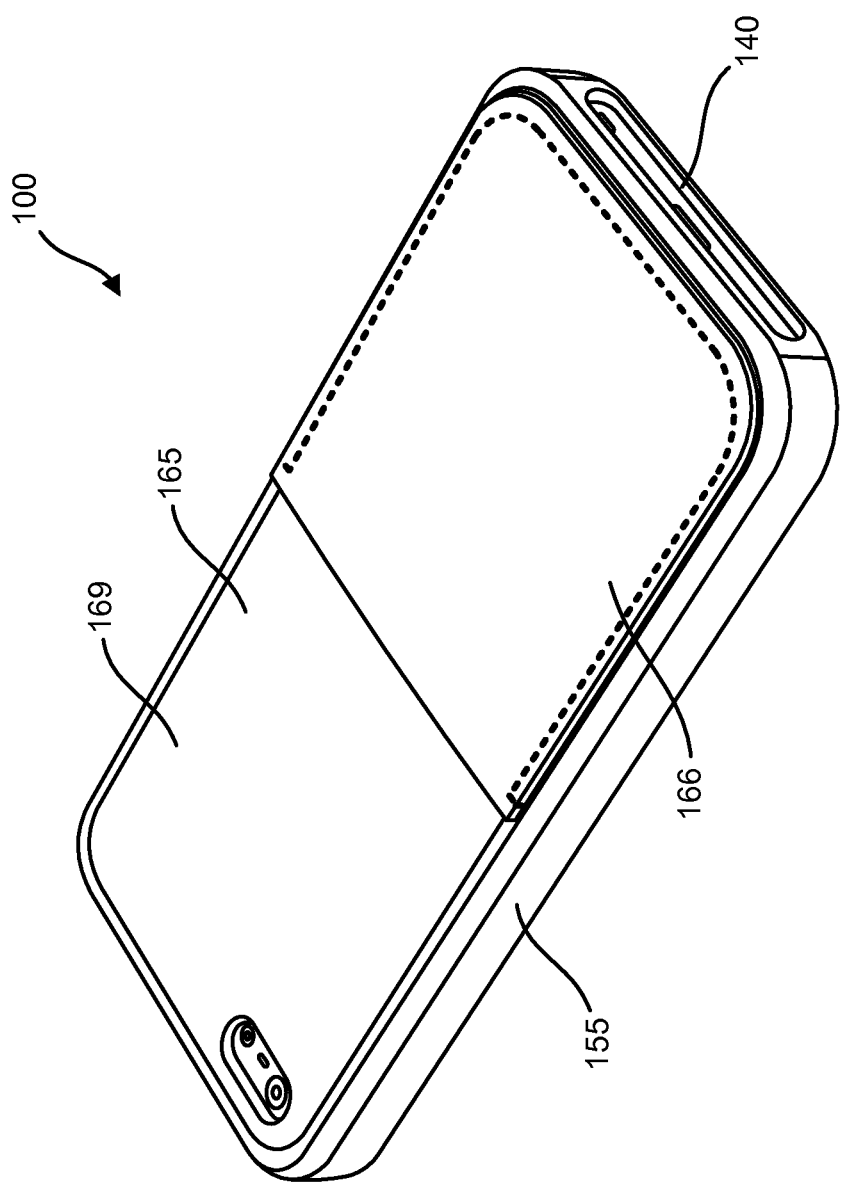
FIG. 15 shows a rear perspective view of a protective case with a pocket configured to receive and store one or more cards.
Figure 16:
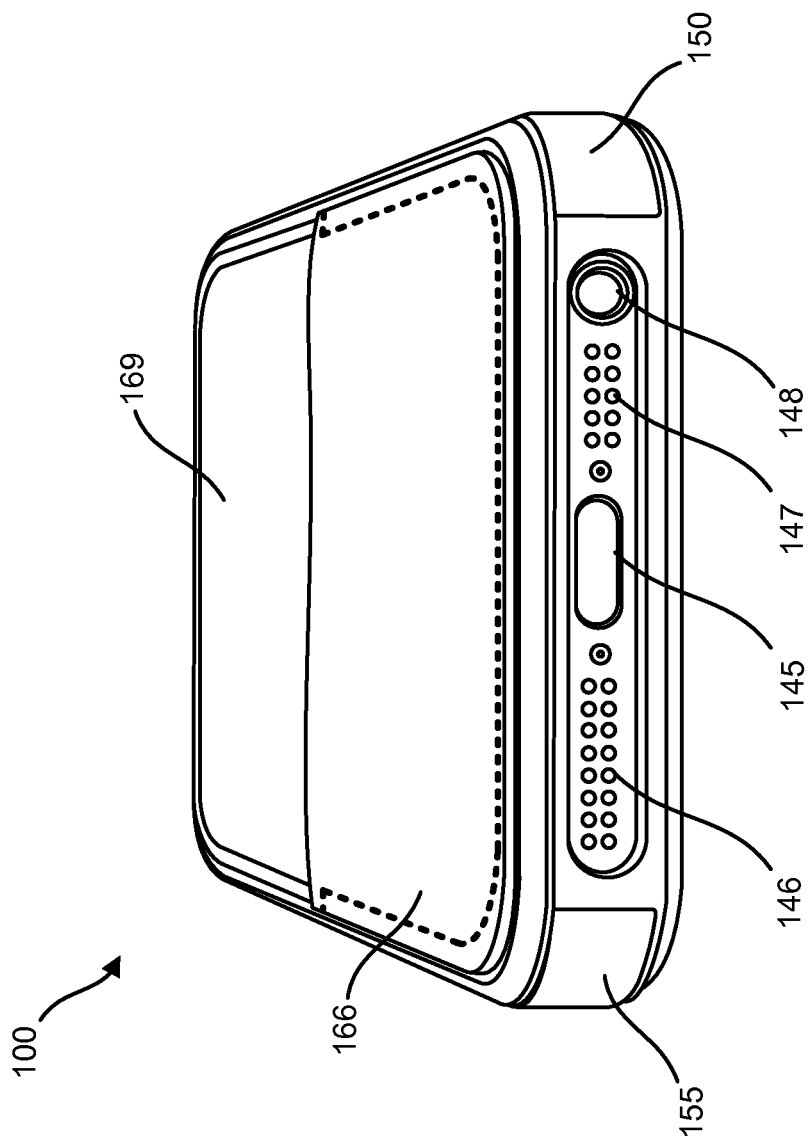
FIG. 16 shows a bottom perspective view of a protective case with a pocket configured to receive and store one or more cards.
Figure 17:
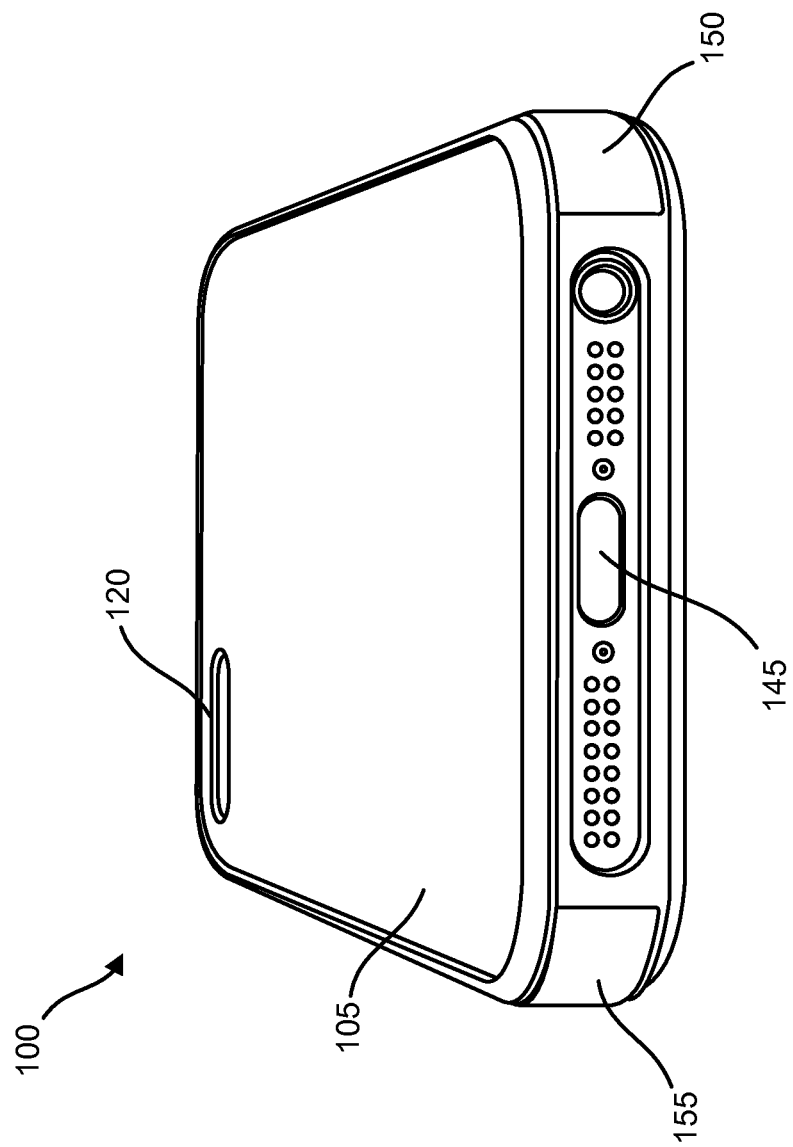
FIG. 17 shows a bottom perspective view of a protective case surrounding a mobile electronic device.

In many instances, it can be desirable to have a protective case 100 that is capable of storing a card 167, such as a credit card, debit card, or driver's license. This feature can allow a user to leave their wallet or purse at home when only a few cards are needed. Various examples of protective cases 100 with pockets are presented in FIGS. 14A-16. The pocket 166 can be affixed to a rear surface 169 of the protective case 100 by any suitable method, such as adhesive, over-molding, or stitching. The pocket 166 can be configured to receive a card 167, such as a payment card or identification card, and the pocket can have any suitable size. In one example shown in FIGS. 14A and 14B, the pocket 166 can have a width of about 2-3, 2.13-2.15, 2.13-2.18, 2.13-2.23, or 2.13-2.33 inches. The pocket 166 can conceal all or a part of the card 167. As shown in FIG. 14B, the pocket 166 can conceal about two-thirds of the card 167 to permit the card to be easily withdrawn from the pocket. In other examples, the pocket 166 can conceal all or most of the card 167 to provide added security against loss or theft of the card. For instance, the pocket 166 can have a length that is approximately equal to the length of the card (e.g 3.38-3.40, 3.38-3.43, 3.38-3.48, or 3.38-3.58 inches) and can include an access opening 168, as shown in FIG. 14A, in the pocket to permit a user to urge the card out of the pocket using their finger. The access opening 168 in the pocket 166 can be located near a top side of the pocket or near a bottom side of the pocket (as shown in FIG. 14A) and can be about the size of a user's fingertip. To prevent the card 167 from accidentally falling out of the pocket 166, a rear surface 169 of the protective case 100 can include a material, such as suede, leather, wool, felt, synthetic suede, or any other suitable synthetic or natural material, that provides a static coefficient of friction that prevents the card 167 from inadvertently sliding out of the pocket. In some examples, the static coefficient of friction can be about 0.2-0.65, 0.25-0.5, 0.25-0.35, or 0.4-0.6.

As described above, the protective case 100 can include a surface covering having a back surface covering 165, as shown in FIGS. 1-3. In another example, the sliding back portion 105 may not have a back surface covering 165. The sliding back portion 105 can be made of alkali-aluminosilicate sheet toughened glass, wood, bamboo, metal, or composite material. A metallic sliding back portion 105 be treated by any suitable process to further increase its durability, scratch resistance, or corrosion resistance. The metal sliding back portion 105 or the chassis 180 can be bead blasted, anodized, or coated. Suitable coating methods can include, for example, electroplating or physical vapor deposition (PVD) (e.g. cathode arc deposition, electron beam PVD, evaporative deposition, pulsed laser deposition, sputter deposition, spray-physical PVD). Suitable coatings can include, for example, chrome, nickel, ceramic, gold, platinum, palladium, titanium nitride, chromium nitride, titanium aluminum nitride, zinc, zirconium, titanium, zirconium nitride, silver, or a combination thereof.

A protective case 100 for an electronic device can include a chassis having a cavity configured to receive an electronic device. The cavity can include an inner left side surface, an inner right side surface, an inner top side surface, an inner bottom side surface, and an inner front side surface. The chassis can include a left side rail receiver and a right side rail receiver. The protective case can include a first cushion layer covering at least a portion of the inner left side surface of the cavity, a second cushion layer covering at least a portion of the inner right side surface of the cavity, a third cushion layer covering at least a portion of the inner top side surface of the cavity, a fourth cushion layer covering at least a portion of the inner bottom side surface of the cavity, and a fifth cushion layer covering at least a portion of the inner front side surface of the cavity. The protective case can include a sliding back portion configured to slidably attach to the chassis. The sliding back portion can include a left side rail and a right side rail, where the left side rail is configured to slidably engage the left side rail receiver and the right side rail configured to slidably engage the right side rail receiver. The sliding back portion can include an inner surface, an outer surface, a channel formed in the inner surface of the sliding back portion, and a back side cushion layer disposed in the channel. The back side cushion layer can include a back side raised portion extending from the back side cushion layer and configured to provide a back air gap between the inner surface of the sliding back portion and a back surface of an electronic device when the electronic device is installed in the protective case.

The protective case can include a left side raised portion extending from the first cushion layer covering. The left side raised portion can be configured to provide a left side air gap between the first cushion layer and a left side of the electronic device when the electronic device is installed in the protective case. The left side air gap can be about 0.005-0.1, 0.005-0.08, 0.01-0.05, 0.02-0.04, or 0.01-0.03 in. The left side raised portion can have a length of about 0.125-8.0, 0.5-6.0, 2.0-6.0, 4.0-6.0, or 5.0-6.0 inches.

The protective case can include a right side raised portion extending from the second cushion layer covering. The right side raised portion can be configured to provide a right side air gap between the second cushion layer and a right side of the electronic device when the electronic device is installed in the protective case. The right side air gap can be about 0.005-0.1, 0.005-0.08, 0.01-0.05, 0.02-0.04, or 0.01-0.03 in. The right side raised portion can have a length of about 0.125-8.0, 0.5-6.0, 2.0-6.0, 4.0-6.0, or 5.0-6.0 inches.

The protective case can include a front side raised portion extending from the fifth cushion layer covering. The front side raised portion configured to provide a front side air gap between the fifth cushion layer and a right side of the electronic device when the electronic device is installed in the protective case. The front side air gap can be about 0.005-0.1, 0.005-0.08, 0.01-0.05, 0.02-0.04, or 0.01-0.03 in. The front side raised portion can have a length of about 0.125-8.0, 0.5-6.0, 2.0-6.0, 4.0-6.0, or 5.0-6.0 inches.

The protective case can have a camera air gap between the inner surface of the sliding back portion and a back surface of the electronic device when the electronic device is installed in the protective case. The camera air gap can be configured to prevent abrasion to a camera lens and camera flash located on the back surface of the electronic device during installation of the sliding back portion. The camera air gap can be about 0.005-0.1, 0.005-0.08, 0.01-0.05, or 0.01-0.03 in.

The chassis can include an outer left side surface, an outer right side surface, an outer top side surface, a left side surface covering attached to the outer left side surface of the chassis, a right side surface covering affixed to the outer right side surface of the chassis, and a top side surface covering affixed to the outer top side surface of the chassis. The sliding back portion can include a pocket attached to the outer surface of the sliding back portion, and the pocket can be configured to receive a payment card or identification card.

Figure 8:
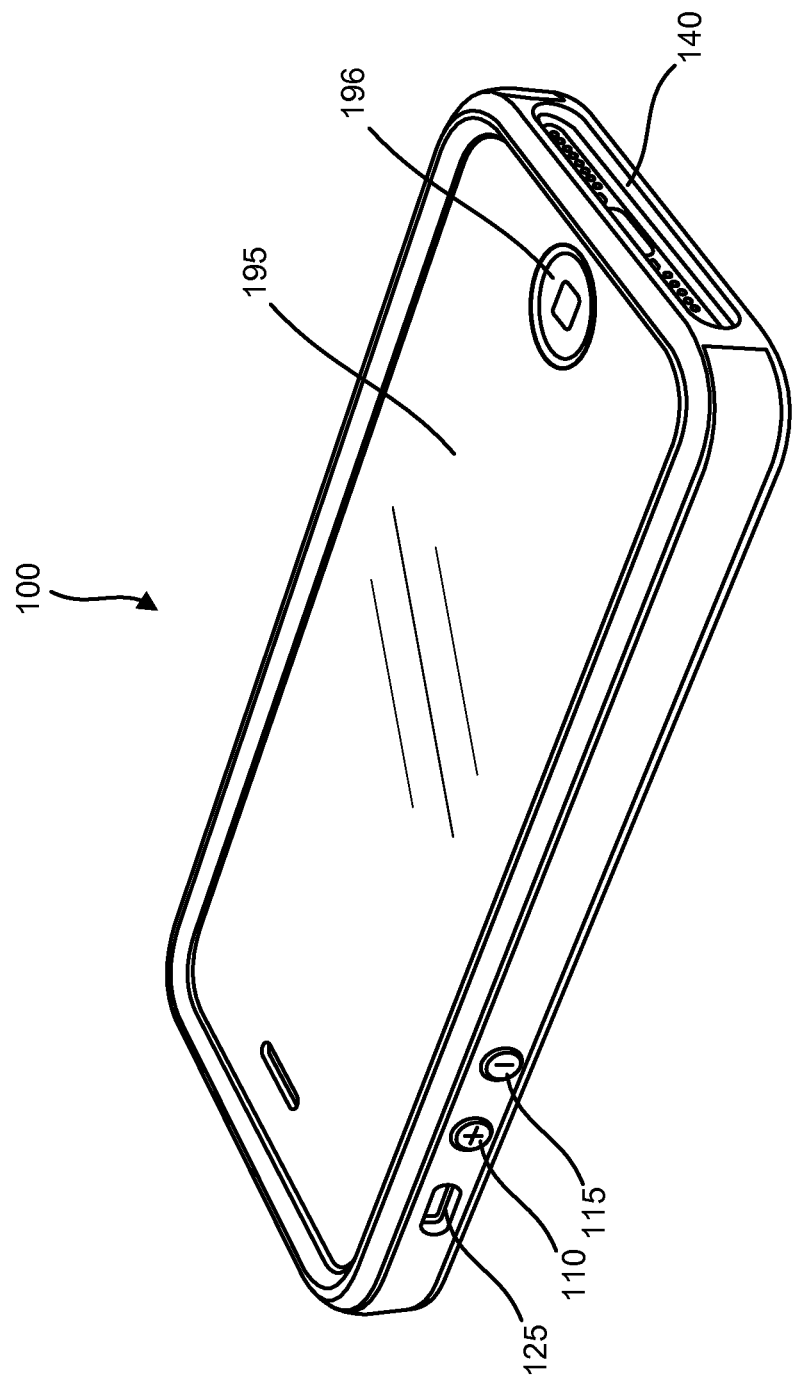
FIG. 8 shows a front perspective view of a protective case housing an electronic device, where the protective case includes a transparent layer covering an interactive touchscreen of the electronic device.
Figure 9:
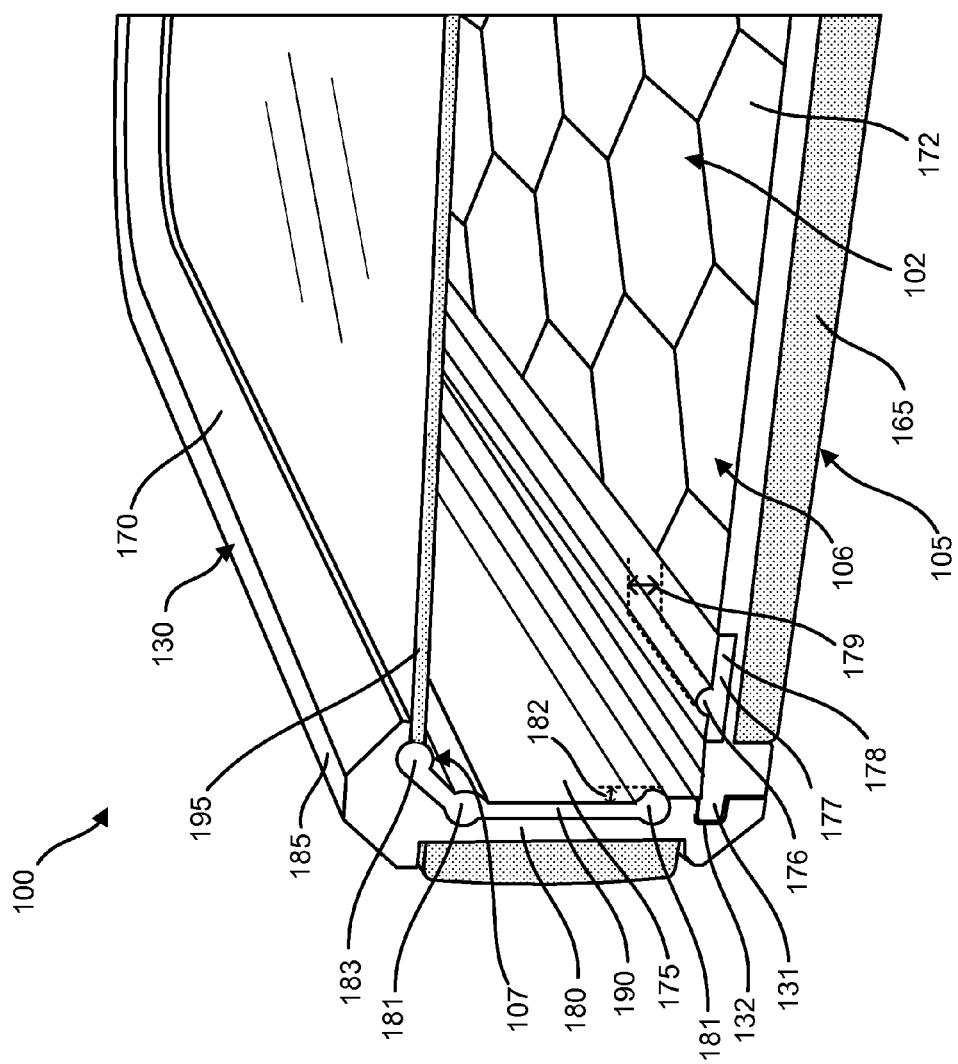
FIG. 9 shows a partial cross-sectional view of the protective case of FIG. 7 where the protective case includes a transparent layer configured to cover and protect an interactive touchscreen of the electronic device.

In some examples, the protective case 100 can include a transparent layer 195 proximate a front side surface of the protective case. The transparent layer 195 can be a flexible membrane, such as a polyurethane membrane, or a sheet of glass, such as alkali-aluminosilicate sheet toughened glass or sapphire glass. Toughened glass or sapphire glass can resist scratching and can provide a feel that is similar to the interactive touchscreen of the electronic device, which is desirable to many users. As shown in FIG. 8, the transparent layer 195 can include an opening to provide access to one or more features of the electronic device 50, such as a speaker or a home button 196. FIG. 9 shows a partial cross-sectional view of the protective case shown in FIG. 8. The transparent layer 195 can be adhered to the protective case 100 by any suitable method, such as with an adhesive layer. In some examples, the transparent layer 195 can be attached to the inner surface of the bezel 130 with a pressure sensitive adhesive.

Figure 10:
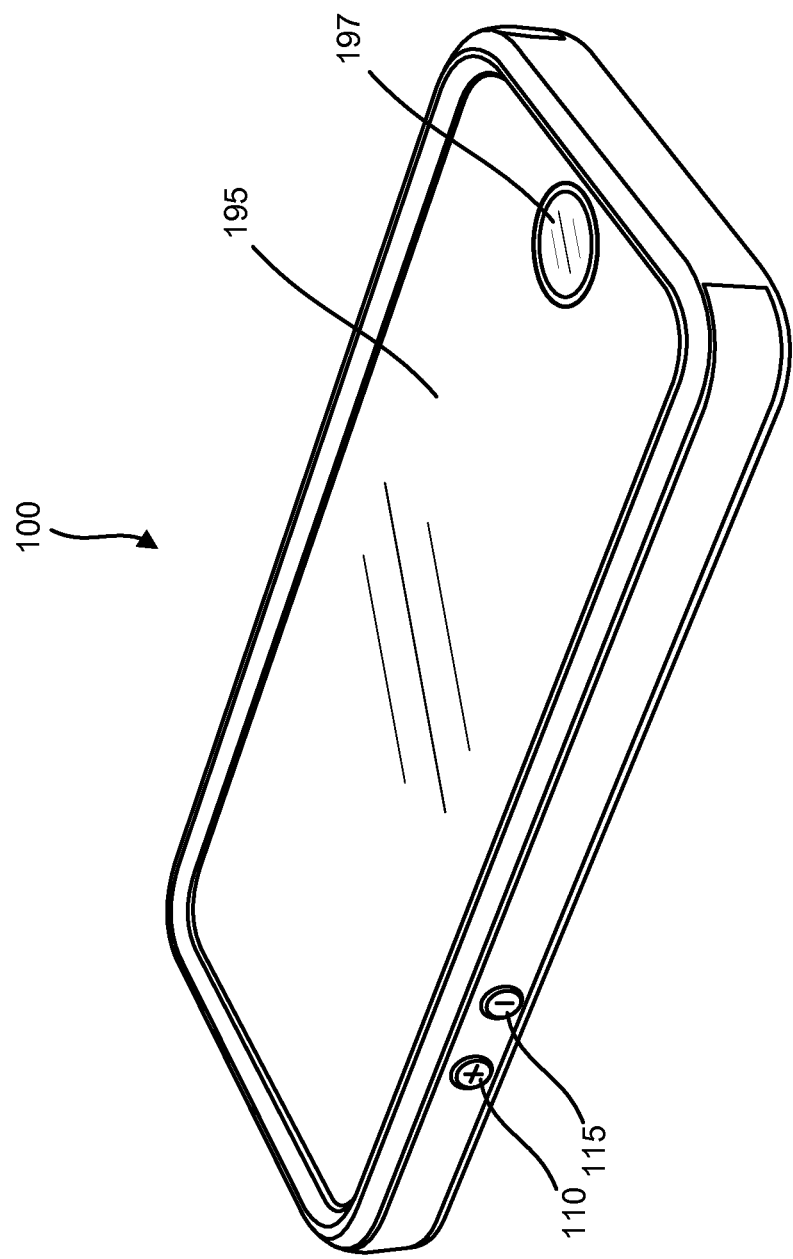
FIG. 10 shows a front perspective view of a waterproof protective case for an electronic device, where the protective case includes a transparent layer covering an interactive touchscreen of the electronic device.

FIG. 10 shows a waterproof protective case 100 for an electronic device. The waterproof case 100 can include a transparent layer 195 that is positioned proximate an interactive touchscreen of the mobile electronic device 50 when the device is installed in the protective case. The waterproof case 100 can also include a home button cover 197. The home button cover can be made of the same material as the transparent layer 195 or of a different material. Where the home button 196 is a mechanical button that is capable of moving up and down, the home button cover 197 can be flexibly connected to the transparent layer 195 to permit up and down motion of the home button cover to effectively actuate the home button. Where the home button 196 includes a biometric sensor, such as a fingerprint scanner, the home button cover 197 can be configured to be compatible with the biometric sensor. For example, the home button cover 197 can be made of a suitable material and have a suitable thickness to permit operation of the biometric sensor through the home button cover. For instance, where the biometric sensor is a fingerprint scanner, the home button cover 197 can be made of a polyurethane membrane having a thickness of about 0.001-0.006 inches. In another example, the home button cover 197 can be made of a layer of polymer or glass (e.g. sapphire glass) having a thickness of about 0.001-0.010 or 0.001-0.020 inches.

Figure 11:
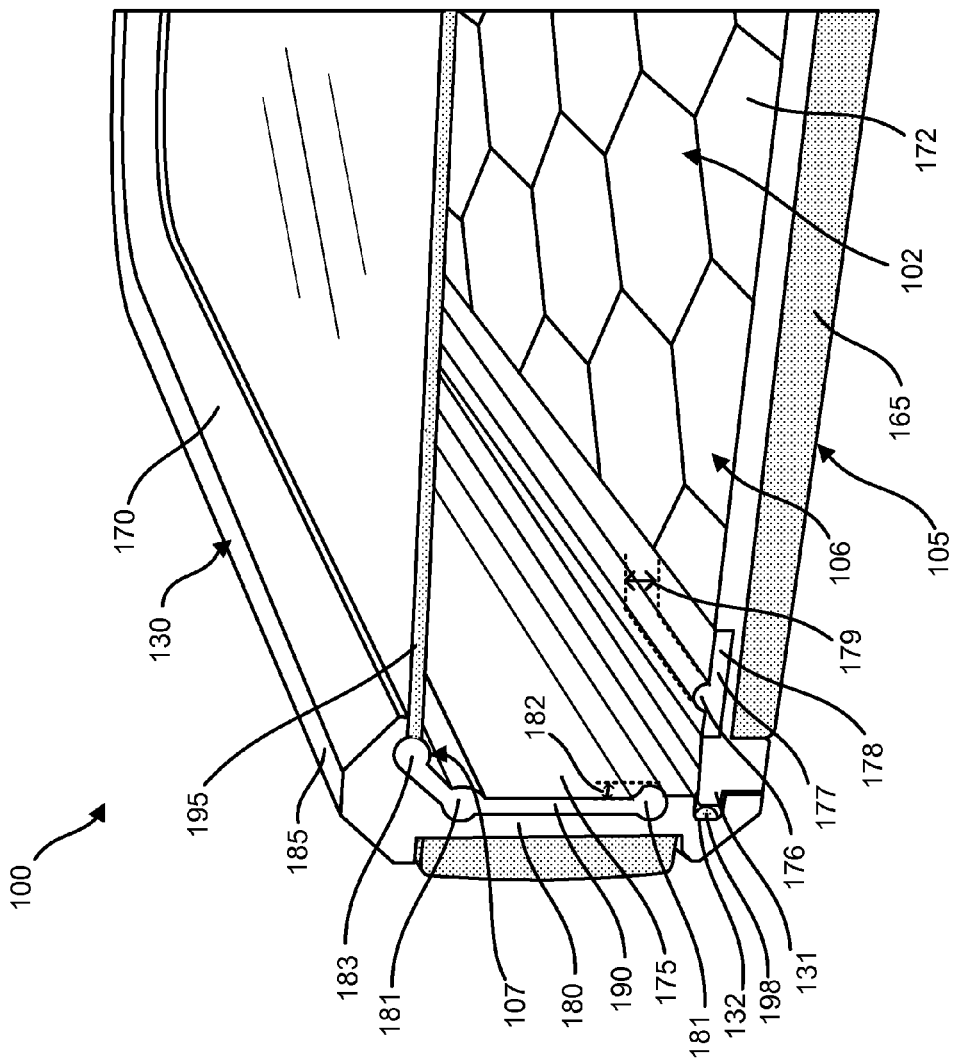
FIG. 11 shows a partial cross-sectional view of a waterproof protective case including a transparent layer configured to cover and protect an interactive touchscreen of an electronic device.
Figure 12:
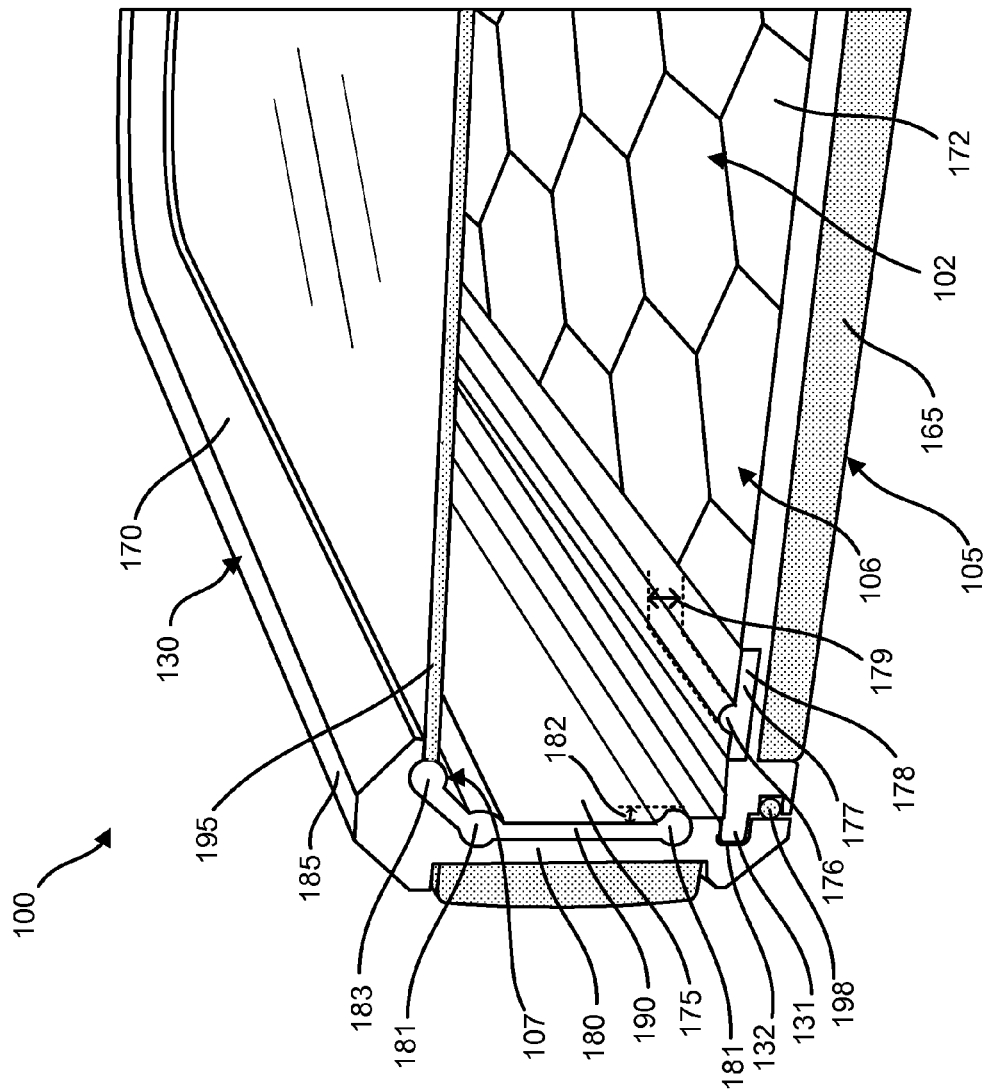
FIG. 12 shows a partial cross-sectional view of a waterproof protective case including a transparent layer configured to cover and protect an interactive touchscreen of an electronic device.

As shown in FIGS. 11 and 12, the waterproof protective case 100 can include a seal or gasket 198 between the rail 131 and the rail receiver 132 to ensure a liquid tight seal between the sliding back portion 105 and the chassis 180 of the case. In some examples, as shown in FIG. 11, the seal 198 can be disposed within the rail receiver and configured to be slightly compressed by the rail 131 during installation of the sliding back portion 105 onto the case. By slightly compressing the seal 198, a liquid-tight seal is formed. In other examples, as shown in FIG. 12, the seal 198 can be disposed in a channel within the sliding back portion and can be slightly compressed against the chassis 180 during installation of the sliding back portion onto the case. By slightly compressing the seal 198, a liquid-tight seal is formed.

FIG. 13 shows an example of a waterproof protective case 100 for an electronic device 50. The waterproof protective case 100 can include a seal 198 as shown in FIG. 11 or 12 to provide a liquid-tight seal between the sliding back portion 105 and the chassis 180. The waterproof protective case 100 can also include a seal 134 that is configured to seal against a front surface 52 of the electronic device 50. By sealing directly against the front surface of the device, the protective case does not require a transparent layer 195.

In one example, a protective case for an electronic device can include a chassis having a cavity configured to receive an electronic device. The cavity can include an inner left side surface, an inner right side surface, an inner top side surface, an inner bottom side surface, and an inner front side surface. The chassis can include a left side rail receiver disposed in the inner left side of the chassis and a right side rail receiver disposed in the inner right side of the chassis.

The protective case can include a sliding back portion having an inner surface and an outer surface. The sliding back portion can slidably attach to the chassis. The sliding back portion can include a left side rail extending from a left side of the sliding back portion and a right side rail extending from a right side of the sliding back portion. The left side rail can be configured to slidably engage the left side rail receiver of the chassis, and the right side rail can be configured to slidably engage the right side rail receiver of the chassis.

The protective case can include an internal suspension system having a back side suspension portion extending into the cavity from an inner surface of the sliding back portion. The back side suspension portion can be configured to contact a back surface of the electronic device when the electronic device is installed in the protective case. The internal suspension system can include a right side suspension portion extending into the cavity from an inner right side surface of the chassis and configured to contact a right side surface of the electronic device when the electronic device is installed in the protective case. The internal suspension system can include a left side suspension portion extending into the cavity from an inner left side surface of the chassis. The left side suspension system can be configured to contact a left side surface of the electronic device when the electronic device is installed in the protective case. The internal suspension system can include a front side suspension portion extending into the cavity from an inner front side surface of the chassis. The front side suspension portion can be configured to contact a front surface of the electronic device when the electronic device is installed in the protective case.

The back side suspension portion can be configured to provide a first air gap of at least 0.005 in., where the first air gap is measured between the back surface of the electronic device and the inner surface of the sliding back portion when the electronic device is installed in the protective case and the sliding back portion is installed on the protective case. The right side suspension portion can be configured to provide a second air gap of at least 0.005 in., where the second air gap is measured between the right side surface of the electronic device and the inner right side surface of the chassis when the electronic device is installed in the protective case and the sliding back portion is installed on the protective case. The left side suspension portion can be configured to provide a third air gap of at least 0.005 in., where the third air gap is measured between the left side surface of the electronic device and the inner left side surface of the chassis when the electronic device is installed in the protective case and the sliding back portion is installed on the protective case. The front side suspension portion can be configured to provide a fourth air gap of at least 0.005 in., where the fourth air gap is measured between the front surface of the electronic device and the inner front side surface of the chassis when the electronic device is installed in the protective case and the sliding back portion is installed on the protective case.

The protective case can include a transparent layer attached to the inner front surface of the chassis. The transparent layer can be configured to be positioned proximate to the interactive touchscreen of the electronic device when the electronic device is installed in the protective case. In some examples, the transparent layer can be made of polyurethane, polyethylene, sheet toughened glass, or sapphire glass. The transparent layer can have a thickness of about 0.001-0.020, 0.001-0.01, or 0.001-0.006.

In one example, a waterproof protective case for an electronic device can include a chassis having a cavity. The cavity can be configured to receive an electronic device. The cavity can have an inner left side surface, an inner right side surface, an inner top side surface, an inner bottom side surface, and an inner front side surface. The chassis can include a left side rail receiver disposed in the inner left side of the chassis and a right side rail receiver disposed in the inner right side of the chassis.

The waterproof protective case can include a sliding back portion having an inner surface and an outer surface. The sliding back portion can be configured to slidably attach to the chassis. A first seal can be disposed in a channel in the sliding back portion. The first seal can be configured to provide a liquid-tight seal between the sliding back portion and the chassis when the sliding back portion is installed on the protective case. The waterproof protective case can include an internal suspension system having a back side suspension portion extending into the cavity from an inner surface of the sliding back portion, where the back side suspension portion is configured to contact a back surface of the electronic device when the electronic device is installed in the protective case. The internal suspension system can include a right side suspension portion extending into the cavity from an inner right side surface of the chassis, where the right side suspension portion is configured to contact a right side surface of the electronic device when the electronic device is installed in the protective case. The internal suspension system can include a left side suspension portion extending into the cavity from an inner left side surface of the chassis, where the left side suspension portion is configured to contact a left side surface of the electronic device when the electronic device is installed in the protective case.

The sliding back portion can include a left side rail extending from a left side of the sliding back portion and a right side rail extending from a right side of the sliding back portion. The left side rail can be configured to slidably engage the left side rail receiver of the chassis, and the right side rail can be configured to slidably engage the right side rail receiver of the chassis.

The waterproof protective case can include a front side suspension portion extending into the cavity from an inner front side surface of the chassis, where the front side suspension portion can be configured to contact a front surface of the electronic device when the electronic device is installed in the protective case.

The waterproof protective case can include a transparent layer attached to the inner front surface of the chassis. The transparent layer can be configured to be positioned proximate an interactive touchscreen of the electronic device when the electronic device is installed in the protective case. In some examples, the transparent layer can be made of polyurethane, polyethylene, sheet toughened glass, or sapphire glass. The transparent layer can have a thickness of about 0.001-0.020, 0.001-0.01, or 0.001-0.006. In some examples, the waterproof protective case can include an opening in the transparent layer. The opening in the transparent layer can be occupied by a home button cover flexibly or rigidly connected to the transparent layer. The home button cover can permit actuation of or interaction with a home button (such as a home button include a biometric sensor) of the electronic device when the electronic device is installed in the protective case.

The waterproof protective case can include a second seal extending from the inner front surface of the chassis. The second seal can be configured to provide a liquid-tight seal between the second seal and the front surface of the electronic device when the electronic device is installed in the waterproof protective case.

In some examples, a protective case can be configured to preserve resale value of an electronic device. The protective case can include a chassis having a cavity configured to receive the electronic device. The cavity can have an inner left side surface, an inner right side surface, an inner top side surface, an inner bottom side surface, and an inner front side surface. The chassis can include a left side rail receiver and a right side rail receiver. The protective case can include an internal suspension system having a first cushion layer covering at least a portion of the inner left side surface of the cavity, a second cushion layer covering at least a portion of the inner right side surface of the cavity, a third cushion layer covering at least a portion of the inner top side surface of the cavity, a fourth cushion layer covering at least a portion of the inner bottom side surface of the cavity, and a fifth cushion layer covering at least a portion of the inner front side surface of the cavity.

The protective case can include a sliding back portion configured to slidably attach to the chassis. The sliding back portion can include a left side rail and a right side rail. The left side rail can be configured to slidably engage the left side rail receiver, and the right side rail can be configured to slidably engage the right side rail receiver. The sliding back portion can include an inner surface, an outer surface, a channel formed in the inner surface of the sliding back portion, a back side cushion layer disposed in the channel, the back side cushion layer comprising a back side raised portion extending from the back side cushion layer and configured to provide a back air gap between the inner surface of the sliding back portion and a back surface of an electronic device when the electronic device is installed in the protective case.

The protective case can include a left side suspension portion extending from the first cushion layer covering. The left side suspension portion can be configured to provide a left side air gap between the first cushion layer and a left side of the electronic device when the electronic device is installed in the protective case. The left side air gap can be about 0.005-0.1, 0.005-0.08, 0.01-0.05, 0.02-0.04, or 0.01-0.03 in.

The protective case can include a right side suspension portion extending from the second cushion layer covering. The right side suspension portion can be configured to provide a right side air gap between the second cushion layer and a right side of the electronic device when the electronic device is installed in the protective case. The right side air gap can be about 0.005-0.1, 0.005-0.08, 0.01-0.05, 0.02-0.04, or 0.01-0.03 in.

The protective case can include a front side suspension portion extending from the fifth cushion layer covering. The front side suspension portion can be configured to provide a front side air gap between the fifth cushion layer and a right side of the electronic device when the electronic device is installed in the protective case. The front side air gap can be about 0.005-0.1, 0.005-0.08, 0.01-0.05, 0.02-0.04, or 0.01-0.03 in.

The protective case can include a camera air gap between the inner surface of the sliding back portion and a back surface of the electronic device when the electronic device is installed in the protective case. The camera air gap can be configured to prevent abrasion to a camera lens and camera flash located on the back surface of the electronic device during installation of the sliding back portion. The camera air gap can be about 0.005-0.1, 0.005-0.08, 0.01-0.05, or 0.01-0.03 in.

The chassis of the protective case can include an outer left side surface, an outer right side surface, an outer top side surface, a left side surface covering attached to the outer left side surface of the chassis, a right side surface covering affixed to the outer right side surface of the chassis, and a top side surface covering affixed to the outer top side surface of the chassis.

The foregoing description has been presented for purposes of illustration and description. It is not intended to be exhaustive or to limit the claims to the embodiments disclosed. Other modifications and variations may be possible in view of the above teachings. The embodiments were chosen and described to explain the principles of the invention and its practical application to enable others skilled in the art to best utilize the invention in various embodiments and various modifications as are suited to the particular use contemplated. It is intended that the claims be construed to include other alternative embodiments of the invention except insofar as limited by the prior art.

What is claimed is:

1. A protective case for an electronic device, the protective case comprising:
    a chassis comprising a cavity configured to receive the electronic device, the cavity comprising an inner left side surface, an inner right side surface, an inner top side surface, an inner bottom side surface, and an inner front side surface, the chassis further comprising a left side rail receiver disposed in the inner left side of the chassis and a right side rail receiver disposed in the inner right side of the chassis;
    a sliding back portion comprising an inner surface and an outer surface, the sliding back portion configured to slidably attach to the chassis, the sliding back portion comprising a left side rail extending from a left side of the sliding back portion and a right side rail extending from a right side of the sliding back portion, the left side rail configured to slidably engage the left side rail receiver of the chassis and the right side rail configured to slidably engage the right side rail receiver of the chassis; and
    an internal suspension system comprising a back side suspension portion extending into the cavity from an inner surface of the sliding back portion and configured to contact a back surface of the electronic device when the electronic device is installed in the protective case, a right side suspension portion extending into the cavity from the inner right side surface of the chassis and configured to contact a right side surface of the electronic device when the electronic device is installed in the protective case, a left side suspension portion extending into the cavity from the inner left side surface of the chassis and configured to contact a left side surface of the electronic device when the electronic device is installed in the protective case, and a front side suspension portion extending into the cavity from the inner front side surface of the chassis and configured to contact a front surface of the electronic device when the electronic device is installed in the protective case.

2. The protective case of claim 1, wherein the back side suspension portion is configured to provide a first air gap of at least 0.005 in., wherein the first air gap is measured between the back surface of the electronic device and the inner surface of the sliding back portion when the electronic device is installed in the protective case and the sliding back portion is installed on the protective case.

3. The protective case of claim 1, wherein the right side suspension portion is configured to provide a second air gap of at least 0.005 in., wherein the second air gap is measured between the right side surface of the electronic device and the inner right side surface of the chassis when the electronic device is installed in the protective case and the sliding back portion is installed on the protective case.

4. The protective case of claim 1, wherein the left side suspension portion is configured to provide a third air gap of at least 0.005 in., wherein the third air gap is measured between the left side surface of the electronic device and the inner left side surface of the chassis when the electronic device is installed in the protective case and the sliding back portion is installed on the protective case.

5. The protective case of claim 1, wherein the front side suspension portion is configured to provide a fourth air gap of at least 0.005 in., wherein the fourth air gap is measured between the front surface of the electronic device and the inner front side surface of the chassis when the electronic device is installed in the protective case and the sliding back portion is installed on the protective case.

6. The protective case of claim 1, further comprising a transparent layer attached to the inner front surface of the chassis, the transparent layer configured to be positioned proximate an interactive touchscreen of the electronic device when the electronic device is installed in the protective case.

7. The protective case of claim 6, wherein the transparent layer comprises sapphire glass.

8. A waterproof protective case for an electronic device, the protective case comprising:
    a chassis comprising a cavity configured to receive the electronic device, the cavity comprising an inner left side surface, an inner right side surface, an inner top side surface, an inner bottom side surface, and an inner front side surface, the chassis further comprising a left side rail receiver disposed in the inner left side of the chassis and a right side rail receiver disposed in the inner right side of the chassis;
    a sliding back portion comprising an inner surface and an outer surface, the sliding back portion configured to slidably attach to the chassis, a first seal disposed in a channel in the sliding back portion, the first seal configured to provide a liquid-tight seal between the sliding back portion and the chassis when the sliding back portion is installed on the protective case; and
    an internal suspension system comprising a back side suspension portion extending into the cavity from the inner surface of the sliding back portion and configured to contact a back surface of the electronic device when the electronic device is installed in the protective case, a right side suspension portion extending into the cavity from the inner right side surface of the chassis and configured to contact a right side surface of the electronic device when the electronic device is installed in the protective case, and a left side suspension portion extending into the cavity from the inner left side surface of the chassis and configured to contact a left side surface of the electronic device when the electronic device is installed in the protective case.

9. The waterproof protective case of claim 8, wherein the sliding back portion comprises a left side rail extending from a left side of the sliding back portion and a right side rail extending from a right side of the sliding back portion, the left side rail configured to slidably engage the left side rail receiver of the chassis and the right side rail configured to slidably engage the right side rail receiver of the chassis.

10. The waterproof protective case of claim 8, further comprising a front side suspension portion extending into the cavity from the inner front side surface of the chassis and configured to contact a front surface of the electronic device when the electronic device is installed in the protective case.

11. The waterproof protective case of claim 8, further comprising a transparent layer attached to the inner front surface of the chassis, the transparent layer configured to be positioned proximate an interactive touchscreen of the electronic device when the electronic device is installed in the protective case.

12. The protective case of claim 11, further comprising an opening in the transparent layer, the opening in the transparent layer being occupied by a home button cover connected to the transparent layer, the home button cover permitting actuation of a home button of the electronic device when the electronic device is installed in the protective case.

13. The waterproof protective case of claim 8, further comprising a second seal extending from the inner front surface of the chassis, the second seal configured to provide a liquid-tight seal between the second seal and the front surface of the electronic device when the electronic device is installed in the waterproof protective case.

14. A protective case configured to preserve resale value of an electronic device, the protective case comprising:
- a chassis comprising a cavity configured to receive the electronic device, the cavity comprising an inner left side surface, an inner right side surface, an inner top side surface, an inner bottom side surface, and an inner front side surface, the chassis further comprising a left side rail receiver and a right side rail receiver;
- an internal suspension system comprising a first cushion layer covering at least a portion of the inner left side surface of the cavity, a second cushion layer covering at least a portion of the inner right side surface of the cavity, a third cushion layer covering at least a portion of the inner top side surface of the cavity, a fourth cushion layer covering at least a portion of the inner bottom side surface of the cavity, and a fifth cushion layer covering at least a portion of the inner front side surface of the cavity; and
- a sliding back portion configured to slidably attach to the chassis, the sliding back portion comprising a left side rail and a right side rail, the left side rail configured to slidably engage the left side rail receiver and the right side rail configured to slidably engage the right side rail receiver, wherein the sliding back portion comprises an inner surface, an outer surface, a channel formed in the inner surface of the sliding back portion, a back side cushion layer disposed in the channel, the back side cushion layer comprising a back side raised portion extending from the back side cushion layer and configured to provide a back air gap between the inner surface of the sliding back portion and a back surface of an electronic device when the electronic device is installed in the protective case.

15. The protective case of claim 14, further comprising a left side suspension portion extending from the first cushion layer covering, the left side suspension portion configured to provide a left side air gap between the first cushion layer and a left side of the electronic device when the electronic device is installed in the protective case, wherein the left side air gap is about 0.005-0.1, 0.005-0.08, 0.01-0.05, 0.02-0.04, or 0.01-0.03 in.

16. The protective case of claim 14, further comprising a right side suspension portion extending from the second cushion layer covering, the right side suspension portion configured to provide a right side air gap between the second cushion layer and a right side of the electronic device when the electronic device is installed in the protective case, wherein the right side air gap is about 0.005-0.1, 0.005-0.08, 0.01-0.05, 0.02-0.04, or 0.01-0.03 in.

17. The protective case of claim 14, further comprising a front side suspension portion extending from the fifth cushion layer covering, the front side suspension portion configured to provide a front side air gap between the fifth cushion layer and a right side of the electronic device when the electronic device is installed in the protective case, wherein the front side air gap is about 0.005-0.1, 0.005-0.08, 0.01-0.05, 0.02-0.04, or 0.01-0.03 in.

18. The protective case of claim 14, further comprising a camera air gap between the inner surface of the sliding back portion and a back surface of the electronic device when the electronic device is installed in the protective case, the camera air gap configured to prevent abrasion to a camera lens and camera flash located on the back surface of the electronic device during installation of the sliding back portion, wherein the camera air gap is about 0.005-0.1, 0.005-0.08, 0.01-0.05, or 0.01-0.03 in.

19. The protective case of claim 14, wherein the chassis further comprises an outer left side surface, an outer right side surface, an outer top side surface, a left side surface covering attached to the outer left side surface of the chassis, a right side surface covering affixed to the outer right side surface of the chassis, and a top side surface covering affixed to the outer top side surface of the chassis.

20. The protective case of claim 14, further comprising a transparent layer attached to the inner front surface of the chassis, the transparent layer configured to be positioned proximate an interactive touchscreen of the electronic device when the electronic device is installed in the protective case.

* * * * *